United States Patent
DeVoe et al.

(10) Patent No.: US 7,118,845 B2
(45) Date of Patent: Oct. 10, 2006

(54) MULTIPHOTON PHOTOCHEMICAL PROCESS AND ARTICLES PREPARABLE THEREBY

(75) Inventors: Robert J. DeVoe, Oakdale, MN (US); Harvey W. Kalweit, Burnsville, MN (US); Catherine A. Leatherdale, St. Paul, MN (US); Todd R. Williams, Lake Elmo, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 160 days.

(21) Appl. No.: 10/455,675

(22) Filed: Jun. 5, 2003

(65) Prior Publication Data

US 2004/0067451 A1    Apr. 8, 2004

Related U.S. Application Data

(63) Continuation-in-part of application No. 10/311,041, filed as application No. PCT/US01/19164 on Jun. 14, 2001, now Pat. No. 6,852,766, and a continuation-in-part of application No. 10/315,756, filed on Dec. 9, 2002, now abandoned, and a continuation-in-part of application No. 10/263,116, filed on Oct. 2, 2002, and a continuation-in-part of application No. 10/263,013, filed on Oct. 2, 2002, now Pat. No. 7,005,229, and a continuation-in-part of application No. 10/262,927, filed on Oct. 2, 2002, now abandoned.

(60) Provisional application No. 60/211,703, filed on Jun. 15, 2000.

(51) Int. Cl.
    *C08F 2/50* (2006.01)

(52) U.S. Cl. ............ 430/270.1; 430/170; 430/171; 430/286.1; 430/913; 430/914; 430/915; 430/916; 430/320; 430/321; 430/322; 522/7

(58) Field of Classification Search ............ 430/270.1, 430/286.1, 170, 171, 913, 914, 915, 916, 430/320, 321, 322; 522/7
See application file for complete search history.

(56) References Cited

U.S. PATENT DOCUMENTS

| | | | |
|---|---|---|---|
| 2,801,185 A | 7/1957 | Iler et al. |
| 3,018,262 A | 1/1962 | Schroeder et al. |
| 3,117,099 A | 1/1964 | Proops et al. |
| 3,729,313 A | 4/1973 | Smith |
| 3,741,769 A | 6/1973 | Smith |
| 3,779,778 A | 12/1973 | Smith et al. |
| 3,808,006 A | 4/1974 | Smith |
| 3,954,475 A | 5/1976 | Bonham et al. |
| 3,987,037 A | 10/1976 | Bonham et al. |

(Continued)

FOREIGN PATENT DOCUMENTS

EP    0 977 212 A2    2/2000

(Continued)

OTHER PUBLICATIONS

R. D. Allen et al. in "High Performance Acrylic Polymers for Chemically Amplified Photoresist Applications", J. Vac. Sci. Technol. B (1991), 9, 3357-3361.

(Continued)

*Primary Examiner*—Barbara L. Gilliam
(74) *Attorney, Agent, or Firm*—Lucy C. Weiss; David R. Cleveland; Bradford B. Wright

(57) ABSTRACT

A process for fabricating of an article by exposing a photoreactive composition to light under multiphoton absorption conditions. The light passes through an optical system having a final optical element having a numeric aperture in a range of from 0.65 to 1.25, inclusive.

34 Claims, 1 Drawing Sheet

U.S. PATENT DOCUMENTS

| | | | |
|---|---|---|---|
| 4,250,053 | A | 2/1981 | Smith |
| 4,257,915 | A | 3/1981 | Eaton |
| 4,279,717 | A | 7/1981 | Eckberg et al. |
| 4,394,403 | A | 7/1983 | Smith |
| 4,394,433 | A | 7/1983 | Gatzke |
| 4,491,628 | A | 1/1985 | Ito et al. |
| 4,522,958 | A | 6/1985 | Das et al. |
| 4,642,126 | A | 2/1987 | Zador et al. |
| 4,652,274 | A | 3/1987 | Boettcher et al. |
| 4,735,632 | A | 4/1988 | Oxman et al. |
| 4,751,138 | A | 6/1988 | Tumey et al. |
| 4,859,572 | A | 8/1989 | Farid et al. |
| 4,889,792 | A | 12/1989 | Palazzotto |
| 4,954,416 | A | 9/1990 | Wright et al. |
| 4,963,471 | A | 10/1990 | Trout et al. |
| 5,235,015 | A | 8/1993 | Ali et al. |
| 5,238,744 | A | 8/1993 | Williams et al. |
| 5,307,438 | A | 4/1994 | Bilkadi et al. |
| 5,335,240 | A | 8/1994 | Ho et al. |
| 5,496,682 | A | 3/1996 | Quadir et al. |
| 5,545,676 | A | 8/1996 | Palazzotto et al. |
| 5,648,407 | A | 7/1997 | Goetz et al. |
| 5,753,346 | A | 5/1998 | Leir et al. |
| 5,770,737 | A | 6/1998 | Reinhardt et al. |
| 5,856,373 | A | 1/1999 | Kaisaki et al. |
| 5,859,251 | A | 1/1999 | Reinhardt et al. |
| 5,990,479 | A | 11/1999 | Weiss et al. |
| 5,998,495 | A | 12/1999 | Oxman et al. |
| 6,005,707 | A | 12/1999 | Berggren et al. |
| 6,025,406 | A | 2/2000 | Oxman et al. |
| 6,054,007 | A | 4/2000 | Boyd et al. |
| 6,100,405 | A | 8/2000 | Reinhardt et al. |
| 6,322,901 | B1 | 11/2001 | Bawendi et al. |
| 6,501,091 | B1 | 12/2002 | Bawendi et al. |
| 2002/0062782 | A1 | 5/2002 | Norris et al. |

FOREIGN PATENT DOCUMENTS

| | | |
|---|---|---|
| EP | 1 052 312 A1 | 11/2000 |
| WO | WO 98/21521 | 5/1998 |
| WO | WO 99/53242 | 10/1999 |
| WO | WO 00/17655 A1 | 3/2000 |
| WO | WO 00/17656 | 3/2000 |
| WO | WO 00/73421 | 12/2000 |
| WO | WO 01/18283 | 3/2001 |
| WO | WO 01/61040 | 8/2001 |
| WO | WO 01/96409 A2 | 12/2001 |
| WO | WO 01/96452 A2 | 12/2001 |
| WO | WO 01/96915 A2 | 12/2001 |
| WO | WO 01/96917 A2 | 12/2001 |
| WO | WO 01/96952 A2 | 12/2001 |
| WO | WO 01/96958 A2 | 12/2001 |
| WO | WO 01/96959 A2 | 12/2001 |
| WO | WO 01/96961 A2 | 12/2001 |
| WO | WO 01/96962 A2 | 12/2001 |

OTHER PUBLICATIONS

R. D. Allen "Advances in Resist Technology and Processing XII", Proc. SPIE (1995), 2438, 474-485.

Stober et al. in "Controlled Growth of Monodisperse Silica Spheres in the Micron Size Range", Journal of Colloid and Interface Science (1968), 26, 62-69.

Wakabayashi et al. in "Studies on s-Triazines. I. Cotrimerization of Trichloroacetonitrile with Other Nitriles", Bull. Chem. Soc. Japan (1969), 42, 2924-2930.

C. Xu et al. in "Measurement of Two-Photon Excitation Cross Sections of Molecular Fluorophores with Data from 690 to 1050 nm", J. Opt. Soc. Am. B. (1996), 13, 481-491.

I. B. Berlman in *Handbook of Fluorescence Spectra of Aromatic Molecules*, Second Edition, Academic Press, New York, pp. 24-27 (1971).

J. N. Demas et al. in "The Measurement of Photoluminescence Quantum yields. A Review", J. Phys. Chem. (1971) 75, 991-1024.

J. V. Morris et al. in "Fluorescence Quantum Yield Determinations. 9,10-Diphenylanthracene as a Reference Standard in Different Solvents", J. Phys. Chem. (1976), 80, 969-974.

Beringer et al. in "Diaryliodonium Salts. IX. The Synmthesis of Substituted Diphenyliodonium Salts," J. Am. Chem. Soc. (1959), 81, 342-351.

R.A. Andrievsky in "State-of-the-Art and Perspectives in the Field of Particulate Nanostructured Materials", J. Mater Sci. Technol. (1988), 14, 97.

L.L. Beecroft et al. in "Nanocomposite Materials for Optical Applications", Chem. Mater. (1997), 9, 1302-1317.

S. Empedocles in "Detection and Spectroscopy of Single CdSe Nanocrystallite Quantum Dots", pp. 13-27 (1999).

Hirai et al. in "Preparation of Semiconductor Nanoparticle-Polymer Composites by Direct Reverse Micelle Polymerization Using Polymerizable Surfactants", J. Phys. Chem. B. (2000), 104, 8962-8966.

Lee et al. in "Full Color Emission from II-VI Semiconductor Quantum Dot-Polymer Composites", Adv. Mater. (2000), 12(15), 1102-1105.

Bruchez et al. in "Semiconductor Nanocrystals as Fluorescent Biological Labels", Science (1998), 281(5385), pp. 2013-2016.

Hoffman et al. in "Photoinitiated Polymerization of Methyl Methacrylate Using Q-Sized ZnO Colloids", J. Phys. Chem. (1992), 96, 5540-5546.

Ulrich et al. in "Green Emission and Bandgap Narrowing Due to Two-Photon Excitation in Thin Film CdS Formed by Spray Pyrolysis", Semicond. Sci. Technol. (2001), 16, L37-L39.

Hines et al. in "Bright UV-Blume Luminescent Colloidal ZnSe Nanocrystals", Journal of Physical Chemistry B (1998), vol. 102(19), 3654-3657.

Holmes et al. in "Highly Luminscent Silicon Nanocrystals with Discrete Optical Transitions", J. Am. Chem. Soc. (2001), 123, 3743-3748.

M. Albota et al. in "Design of Organic Molecules with Large Two-Photon Absorption Cross Sections", Science (1998), 281, 1653-1656.

B. H. Cumpston et al. in "Two-Photon Polymerization Initiators for Three-Dimensional Optical Data Storage and Microfabrication", Nature (1999), 398, 51-54.

S. Kawata et al. in "Finer Features for Functional Microdevices", Nature (2001), 412, 697-698.

S. Mauro and S. Kawata in "Two-Photon Absorbed Near-Infrared Photopolymerization for Three-Dimensional Microfabrication", J. Microelectromech. Syst. (1998), 7, 411-415.

S. Mauro et al. in "Three-Dimensional Microfabrication with Two-Photon-Absorbed Photopolymerization", Opt. Lett. (1997), 22, 132-134.

K. D. Belfield in "Near-IR Two-Photon Photoinitiated Polymerization Using a Fluorone/Amine Initiating System", J. Am. Chem. Soc. (2000), 122, 1217-1218.

P. J. Campagnola in "3-Dimensional Submicron Polymerization of Acrylamide by Multiphoton Excitation of Xanthene Dyes", Macromol. (2000), 33, 1511-1513.

H.-B. Sun et al. in "Real Three-Dimensional Microstructures Fabricated by Photopolymerization of Resins Through Two-Photon Absorption", Opt. Lett. (2000), 25, 1110-1112.

M. Miwa et al. in "Femtosecond Two-Photon Stereo-Lithography", Appl. Phys. A. (2001), 73, 561-566.

H.-B. Sun et al. in "Three-Dimensional Focal Spots Related to Two-Photon Excitation", Appl. Phys. Lett. (2002), 80, 3673-3675.

S. M. Kuebler et al. in "Optimizing Two-Photon Initiators and Exposure Conditions for Three-Dimensional Lithographic Microfabrication", J. of Photopolymer Science and Technology (2001), 14, 657-668.

Ch. J. Schwarz in "Demonstration of Two-Photon Lithography", J. Vac. Sci. Technol. (2001), 19, 2362-2365.

A. Reiser, "Photoreactive Polymers, The Science and Technology of Resists", John Wiley & Sons, New York, 227-251 (1989).

M. P. Joshi et al. in "Three-Dimensional Optical Circuitry Using Two-Photon-Assisted Polymerization", Appl. Phys. Lett. (1999), 74, 170-172.

Y. Boiko et al. in "High Dynamic Range Cationic Two-Photon Photopolymerization", Proceedings SPIE, Organic Photonic Materials and Devices (2001), 4279, 212-220.

W. Zhou et al. in "Efficient Photoacids Based Upon Triarylamine Dialkylsulfonium Salts", J. Am. Chem. Soc. (2002), 124, pp. 1897-1901.

Tomokazu et al. in "Rapid Sub-Diffraction-Limit Laser Micro/ Nanoprocessing in a Threshold Material System", Applied Physics Letters. (2002), 80, 312-314.

Yokoyama et al. in "Two-Photon-Induced Polymerization in a Laser Gain Medium for Optical Microstructure", Applied Physics Letters (2003), 82, 3221-3223.

S.S. Charschan , Ed., "Guide to Laser Materials Processing", Laser Institute of America, Orlando, pp. 62-64 (1993).

J. Serbin et al. in "Femtosecond laser-induced two-photon polymerization of inorganic-organic hybrid materials for applications in photonics", Optical Society of America (2003), 28(5), 301-303.

Z. Ling et al. in "Improved patterning quality of SU-8 microstructures by optimizing the exposure parameters", Proc. SPIE (2000), 3999, 1019-1027.

DeVoe et al. in "Voxel Shapes in Two-Photon Microfabrication", Proc. SPIE (2002), 4797, 310-316.

A. Chutinan et al. in "Highly Confined Waveguides and Waveguide Bends in Three-Dimensional Photonic Crystal", Appl. Phys. Lett. (1999), 75(24), 3739-3741.

U.S. Appl. No. 10/262,927, filed Oct. 2, 2002, Multi-Photon Reactive Compositions With Inorganic Particles and Method for Fabricating Structures.

U.S. Appl. No. 10/263,013, filed Oct. 2, 2002, Multiphoton Photosensitzation Method.

U.S. Appl. No. 10/263,116, filed Oct. 2, 2002, Multiphoton Photosensitization System.

U.S. Appl. No. 10/315,756, filed Dec. 9, 2002, Process for Producing Controlled Defects in Photonic Crystals.

K. D. Belfield et al. "Multiphoton-absorbing organic Materials for Microfabrication, emerging optical applications and non-destructive three-dimensional imaging", J. Phys. Org. Chem. (2000), 13, 837-849.

S. Maruo et al. in "Optically-Driven Microstructures Fabricated by Two-Photon Microstereolithography", MEMS-vol. 2, Micro-Electro-Mechanical Systems-2000, ASME 2000, 695-699.

Zrinyi et al. in "Novel Gel Actuator Containing TiO2 Particles Operated under Static Electric Field", Macromolecules (2000), 33(16), 5751-5753.

Stellacci et al. in "Laser and Electron-Beam Induced Growth of Nanoparticles for 2D and 3D Metal Patterning," Adv. Mater. (2002), 14(3), 194-198.

R. J. Cox, *Photographic Sensitivity*, Academic Press, New York, pp. 241-263.

D. F. Eaton in *Advances in Photochemistry*, vol. 13, John Wiley & Sons, New York, pp. 427-488 (1986).

C. J. Brinker et al. in *Sol-Gel Science*, Academic Press, New York, pp. 501-505 (1990).

D. J. Norris et al. in "Chemical Approaches to Three-Dimensional Semiconductor Photonic Crystals", Adv. Mater. (2001), 13(6), 371-376.

Busch et al. in "Photonic Band Gap Formation in Certain Self-Organizing Systems", Physical Review E (1998), 58, 3896-3908.

Hoffman et al. in "Q-Sized CdS: Synthesis, Characterization, and Efficiency of Photoinitiation of Polymerization of Several Vinylic Monomers", J. Phys. Chem. (1992), 96, 5546-5552.

Steigerwald et al. in "Surface Derivatization and Isolation of Semiconductor Cluster Molecules", J. Am. Chem. Soc. (1998), 110, 3046-3050.

Brust et al. in Synthesis of Thiol-derivatized Gold Nanoparticles in a Two-phase Liquid-Liquid System:, J. Chem. Soc Chem. Commun. (1994), 801-802.

Mills et al. in "An Overview of Semiconductor photocatalysis", J. Photochem. And Photobiology, Chemistry (1997), 108, 1-35.

Templeton et al. in "Monolayer-Protected Cluster Molecules", Acc. Chem. Res. (2000), 33, 27-36.

Micic et al. in "Enhanced Redux Chemistry in Quantized Semiconductor Colloids", Israel Journal of Chem. (1993), 33, pp. 59-65.

Kamat et al. in "Photoelectrochemistry in Particulate Systems. 5. Visible Light-induced Polymerization of 1-vinylpyrene in Semiconductor Suspensions", Journal of Polymer Science Part A; Polymer Chemistry (1987), 25, 1035-1040.

Murray et al. in "Synthesis and Characterization of Nearly Monodisperse CdE (E = S, Se, Te) Semiconductor Nanocrystallites", J. Am. Chem. Soc. (1993), 115, 8706-8715.

A.P. Alivisatos in "Semiconductor Clusters, Nanocrystals, and Quantum Dots", Science (1996), 271(Feb. 16, 1996), 933-937.

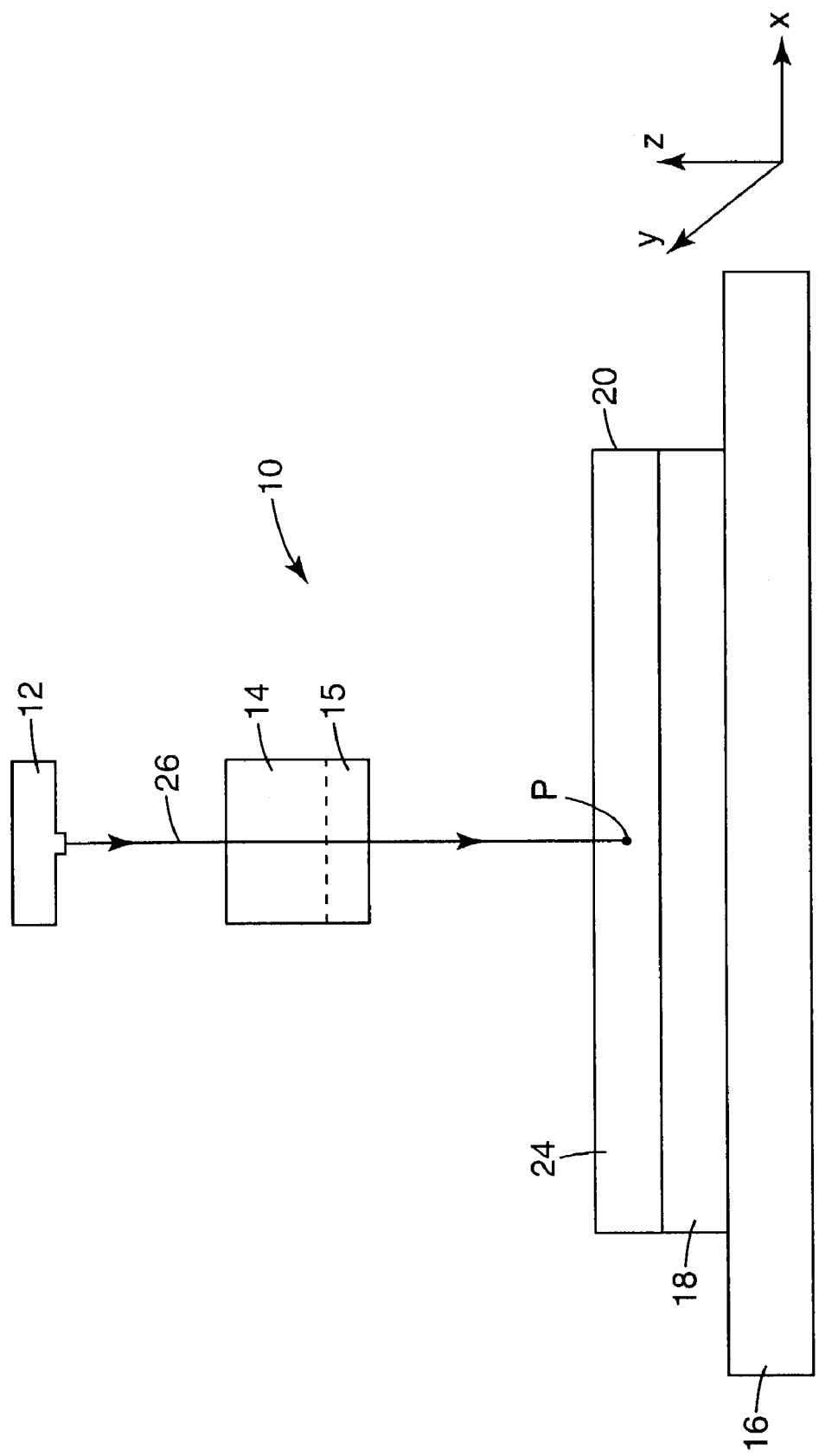

MULTIPHOTON PHOTOCHEMICAL PROCESS AND ARTICLES PREPARABLE THEREBY

CROSS-REFERENCE TO RELATED APPLICATIONS

This application is a continuation-in-part of U.S. application Ser. No. 10/311,041 filed Dec. 12, 2002, now U.S. Pat. No. 6,852,766 B1, which was a national stage filing under 35 U.S.C. 371 of International Application No. PCT/US01/19164 filed Jun. 14, 2001 and claims the priority of U.S. Provisional Application No. 60/211,703 filed Jun. 15, 2000; a continuation-in-part of U.S. application Ser. No. 10/263,116 filed Oct. 2, 2002, now pending; a continuation-in-part of U.S. application Ser. No. 10/263,013 filed Oct. 2, 2002, now U.S. Pat. No. 7,005,229 B2; a continuation-in-part of U.S. application Ser. No. 10/262,927 flied Oct. 2, 2002, now pending; and a continuation-in-part of U.S. application Ser. No. 10/315,756 filed Dec. 9, 2002, now abandoned. The disclosures of application Ser. Nos. 10/263,116, 10/263,013, 10/262,927 and 10/315,756 are incorporated herein by reference.

FIELD

The present invention relates to multiphoton photochemical processes, and to articles preparable thereby.

BACKGROUND

Multiphoton photochemical processes generally involve the simultaneous absorption of two or more photons by an absorbing chromophore. In such processes, the chromophore typically does not absorb at the wavelength of the individual photons, but at sufficiently high intensity a simultaneous absorption of multiple photons by the chromophore occurs. For example, simultaneous absorption of two photons having a wavelength of $\lambda$ has the effect of absorption of a single photon of wavelength $\lambda/2$. Whereas single-photon absorption generally scales linearly with the intensity of the incident radiation, two-photon absorption scales quadratically, and higher-order absorptions scale with a corresponding higher-order power of the intensity of the incident radiation. As a result, it is typically possible to perform multiphoton curing processes with three-dimensional spatial resolution. Furthermore, since the incident radiation is not attenuated by single-photon absorption within a reactive matrix or material, it is generally possible to selectively excite molecules at a greater depth within a material than would be possible via single-photon excitation.

Multiphoton induced photopolymerization, typically using a laser, has been used to fabricate three-dimensional devices with sub-micron resolution. Multiphoton fabrication has been used to manufacture mechanical and optical devices, such as cantilevers, gears, shafts, and microlenses.

SUMMARY

In practice, the resolution achieved in muitiphoton fabrication processes is typically dependent on the size and shape of voxels (i.e., volume pixels). In the case of multiphoton induced reaction of a photoreactive inaterial, the term "voxel" refers to the smallest volume element of reacted photoreactive material that is generated by the multiphoton induced reaction.

By repetition of the voxel, three-dimensional objects may be constructed in analogous manner to the way a two-dimensional object is constructed from pixels. The maximum resolution of a three-dimensional object manufactured in this way is generally limited by the size and shape of the voxel. Asymmetric voxels (e.g., having an aspect ratio of greater than about 1.5) may give rise to structural irregularities in fabricated articles and/or otherwise complicate the fabrication of such articles using computer aided design and fabrication techniques.

In addition to voxel shape, the overall production rate of multiphoton fabrication processes are important for them to be useful in a practical (e.g., commercial) setting where rapid throughput is desirable.

It would be desirable to have methods for generating uniform, low aspect ratio voxels, particularly if the methods have good productivity.

In one aspect, the present invention provides a process comprising:

a) providing a photoreactive composition, the photoreactive composition comprising at least one reactive specie and a photochemically-effective amount of a multiphoton photoinitiator system, wherein the multiphoton photoinitiator system comprises a multiphoton absorber having a two-photon absorption cross section greater than or equal to the maximum two-photon absorption cross-section of fluorescein;

b) exposing at least a portion of the photoreactive composition to light of appropriate wavelength and intensity such that simultaneous absorption of at least two photons by the photoreactive composition occurs, thereby causing at least partial reaction of at least one reactive specie and causing a portion of the photoreactive composition to become more, or less, soluble in at least one solvent than the photoreactive composition before exposure to the light, wherein the light passes through an optical system having a final optical element prior to reaching the photoreactive composition, and wherein the final optical element has a numeric aperture in a range of from 0.65 to 1.25, inclusive; and c) developing the exposed photoreactive composition.

Processes according to the present invention typically have good productivity and/or form voxels having a low aspect ratio. Accordingly, in some embodiments, the process of the present invention may be used to fabricate high-resolution structures.

As used in this patent application:

"cure" means to effect polymerization and/or to effect crosslinking;

"electronic excited state" means an electronic state of a semiconductor nanoparticle, molecule, or ion that is higher in energy than its electronic ground state, that is accessible via absorption of light, and that has a lifetime greater than $10^{-13}$ seconds;

"final optical element" means the last light focusing optical element, or combination of optical elements, in an optical system that focuses light leaving the optical system;

"light" means electromagnetic radiation having a wavelength in a range of from about 300 to about 1500 nm;

"multiphoton absorption" means the simultaneous or sequential absorption of two or more photons of light to reach a reactive, electronic excited state that is energetically inaccessible by the absorption of a single photon of the same energy;

"multiphoton absorber" means a specie capable of undergoing multiphoton absorption of light;

"numeric aperture" means the product of the index of refraction of the object medium multiplied by the sine of the slope angle of the outermost ray from an axial point on the object;

"optical system" means a system for controlling light, including at least one element chosen from refractive optical elements such as lenses (including microlens arrays), reflective optical elements such as mirrors, and diffractive optical elements (including gratings). Optical elements shall also include diffusers, waveguides, and other elements known in the optical arts;

"photochemically effective amount" means an amount sufficient to enable the reactive species to undergo at least partial reaction under the selected exposure conditions (as evidenced, e.g., by a change in density, viscosity, color, pH, refractive index, or other physical or chemical property);

"simultaneous" means two events that occur within the period of $10_{-14}$ seconds or less; and "solvent developing" means substantially removing (e.g., dissolving) soluble material in a solvent while substantially not removing insoluble material.

BRIEF DESCRIPTION OF THE DRAWING

The drawing is a schematic representation of an exemplary multiphoton fabrication system useful for practicing the present invention.

DETAILED DESCRIPTION

In practice of the present invention, a photoreactive composition is exposed to light under conditions such that multiphoton absorption occurs, thereby causing a region of differential solubility (e.g., lesser or greater solubility) as compared to the photoreactive composition prior to exposure. Such exposure may be accomplished by any known means capable of achieving sufficient intensity of the light.

One exemplary type of system that may be used to practice the present invention is shown in the drawing. Referring to the drawing, fabrication system 10 includes light source 12, optical system 14 comprising a final optical element 15, and moveable stage 16. Stage 16 is moveable in one, two, or more typically three dimensions. Substrate 18 mounted on stage 16 has a layer 20 of photoreactive composition 24 thereon. Light beam 26 originating from light source 12 passes through optical system 14 and leaves through final optical element 15 which focuses it to a point P within layer 20, thereby controlling the three-dimensional spatial distribution of light intensity within the composition and causing at least a portion of photoreactive composition 24 in the vicinity of point P to become more, or less, soluble in at least one solvent than it was immediately prior to exposure to light beam 26. By moving stage 16, or by directing light beam 26 (e.g., moving a laser beam using galvo-mirrors) in combination with moving one or more elements of optical system 14, the focal point P can be scanned or translated in a three-dimensional pattern that corresponds to a desired shape. For example, stage 16 can be moved in x and y dimensions and final optical element 15 moved in the z dimension to control the position of point P. The reacted or partially reacted portion of the photoreactive composition 24 then creates a three-dimensional structure of a desired shape.

Light source 12 can be any light source that produces sufficient light intensity to effect multiphoton absorption. Suitable sources include, for example, femtosecond near-infrared titanium sapphire oscillators (e.g., those available from Coherent, Santa Clara, Calif., under the trade designation "MIRA OPTIMA 900-F") pumped by an argon ion laser (e.g., those available from Coherent under the trade designation "INNOVA"). This laser, operating at 76 MHz, has a pulse width of less than 200 femtoseconds, is tunable between 700 and 980 nm, and has average power up to 1.4 Watts. Another useful laser is available from Spectra-Physics, Mountain View, Calif., under the trade designation "MAI TAI", tunable to wavelengths in a range of from 750 to 850 nanometers, and having a repetition frequency of 80 megahertz, and a pulse width of about 100 femtoseconds ($1\times10_{-13}$ sec), with a power level up to 1 Watt.

However, any light source (e.g., a laser) that provides sufficient intensity to effect multiphoton absorption at a wavelength appropriate for the multiphoton absorber used in the photoreactive composition can be utilized. Such wavelengths can generally be in the range of about 300 to about 1500 nm; preferably, from about 400 to about 1100 nm; more preferably, from about 600 to about 900 nm; more preferably, from about 750 to about 850 nm, inclusive. Typically, the light fluence (e.g., peak intensity of a pulsed laser) is greater than about $10^6$ W/cm$^2$. The upper limit on the light fluence is generally dictated by the ablation threshold of the photoreactive composition. For example, Q-switched Nd:YAG lasers (e.g., those available from Spectra-Physics under the trade designation "QUANTA-Ray PRO"), visible wavelength dye lasers (e.g., those available from Spectra-Physics under the trade designation "SIRAH" pumped by a Q-switched Nd:YAG laser from Spectra-Physics having the trade designation "Quanta-Ray PRO"), and Q-switched diode pumped lasers (e.g., those available from Spectra-Physics under the trade designation "FCBAR") can also be utilized.

Preferred light sources are near infrared pulsed lasers having a pulse length less than about $10^{-8}$ second (more preferably, less than about $10^9$ second; more preferably, less than about $10^{-11}$ second). Other pulse lengths can be used as long as the peak intensity and ablation threshold criteria above are met. Pulsed radiation may, for example, have a pulse frequency of from about one kilohertz up to about 50 megahertz, or even more. Continuous wave lasers can also be used.

Optical system 14 may include, for example, refractive optical elements (e.g., lenses or microlens arrays), reflective optical elements (e.g., retroreflectors or focusing mirrors), diffractive optical elements (e.g., gratings, phase masks, and holograms), polarizing optical elements (e.g., linear polarizers and waveplates), dispersive optical elements (e.g. prisms and gratings), diffusers, Pockels cells, waveguides, and the like. Such optical elements are useful for focusing, beam delivery, beam/mode shaping, pulse shaping, and pulse timing. Generally, combinations of optical elements can be utilized, and other appropriate combinations will be recognized by those skilled in the art. Final optical element 15 may include, for example, one or more refractive, reflective, and/or diffractive optical elements. In one embodiment, an objective such as, for example, those used in microscopy may be conveniently obtained from commercial sources such as, for example, Carl Zeiss, North America, Thornwood, New York, and used as final optical element 15. For example, fabrication system 10 can include a scanning confocal microscope (e.g. those available from Bio-Rad Laboratories, Hercules, Calif., under the trade designation "MRC600") equipped with a 0.75 NA objective (such as, e.g., those available from Carl Zeiss, North America under the trade designation "20X FLUAR")

The numeric aperture of final optical element 15 may have any value in the range of from 0.65 to 1.25, inclusive. Useful air objectives typically have a numeric aperture in a range of from 0.65 to about 0.95. Useful liquid objectives (e.g., oil immersion objectives) typically have a numeric aperture in a range of from greater than about 1.0 up to 1.25.

Exposure times generally depend upon the type of exposure system used to cause reaction of the reactive species in the photoreactive composition (and its accompanying variables such as numerical aperture, geometry of light intensity spatial distribution, the peak light intensity during the laser pulse (higher intensity and shorter pulse duration roughly correspond to peak light intensity)), as well as upon the nature of the photoreactive composition. Generally, higher peak light intensity in the regions of focus allows shorter exposure times, everything else being equal. Linear imaging or "writing" speeds generally can be about 5 to 100,000 microns/second using a laser pulse duration of about $10^{-8}$ to $10^{-15}$ second (e.g., about $10^{-11}$ to $10^{-14}$ second) and about $10^2$ to $10^9$ pulses per second (e.g., about $10^3$ to $10^8$ pulses per second).

In order to successfully solvent develop the exposed photoreactive composition and obtain a fabricated structure, a threshold dose of light (i.e., threshold dose) is typically required. This threshold dose is typically process specific, and may depend on variables such as, for example, the wavelength, pulse frequency, intensity of the light, the specific photoreactive composition, the specific structure being fabricated, or the process used for solvent development. Thus, each set of process parameters is typically characterized by a threshold dose. Higher doses of light than the threshold may be used, and may be beneficial, however higher doses (once above the threshold dose) typically require a slower writing speed and/or higher light intensity. Further, it is discovered that increasing the dose tends to increase the volume and aspect ratio of voxels generated by the process. Thus, in order to obtain voxels of low aspect ratio, it is generally preferable to use a light dose that is less than 10 times the threshold dose, preferably less than 4 times the threshold dose, and more preferably less than 3 times the threshold dose.

Further, it is found that in order to obtain voxels of low aspect ratio, the radial intensity profile of light beam 26 is preferably Gaussian.

Through multiphoton absorption, light beam 26 induces a reaction in the photoreactive composition that produces a volume region of material having solubility characteristics different from those of the unexposed photoreactive composition. The resulting pattern of differential solubility can then be realized by a conventional development process, for example, by removing either exposed or unexposed regions. The exposed photoreactive composition can be developed, for example, by placing the exposed photoreactive composition into solvent to dissolve regions of higher solvent solubility, rinsing with solvent, evaporation, oxygen plasma etching, or by other known methods, and combinations thereof. Non-limiting solvents that may be used for developing the exposed photoreactive composition include aqueous solvents such as, for example, water (e.g., having a pH in a range of from 1 to 12) and miscible blends of water with organic solvents (e.g., methanol, ethanol, propanol, acetone, acetonitrile, dimethylformamide, N-methylpyrrolidone, mixtures thereof, and the like); and organic solvents. Exemplary useful organic solvents include alcohols (e.g., methanol, ethanol, propanol), ketones (e.g., acetone, cyclopentanone, methyl ethyl ketone), aromatics (e.g., toluene), halocarbons (e.g., methylene chloride, chloroform), nitriles (e.g., acetonitrile), esters (e.g., ethyl acetate, propylene glycol methyl ether acetate), ethers (e.g., diethyl ether, tetrahydrofuran), amides (e.g., N-methylpyrrolidone), mixtures thereof, and the like.

An optional bake after exposure to light under two-photon absorption conditions, but prior to solvent development, may be useful for some photoreactive compositions such as, for example, epoxy-type reactive species. Typical bake conditions include temperatures in a range of from about 40° C. to about 200° C., for times in a range of from about 0.5 minutes to about 20 minutes.

Complex, seamless three-dimensional structures can be prepared in this manner. The resulting structures can have any suitable size and shape, but the method of the invention is particularly well suited for adding a microstructure to a surface of an article.

The photoreactive composition comprises at least one reactive species and a multiphoton photoinitiator system.

Reactive species suitable for use in the photoreactive compositions include both curable and non-curable species. Curable species include, for example, addition-polymerizable monomers and oligomers and addition-crosslinkable polymers such as, free-radically polymerizable or crosslinkable ethylenically-unsaturated species (e.g., acrylates, methacrylates, and certain vinyl compounds such as styrenes), as well as cationically-polymerizable monomers and oligomers and cationically-crosslinkable polymers (which species are most commonly acid-initiated and which include, e.g., epoxies, vinyl ethers, cyanate esters), and the like, and mixtures thereof.

Suitable ethylenically-unsaturated species are described, for example, by Palazzotto et al. in U.S. Pat. No. 5,545,676 at column 1, line 65, through column 2, line 26, and include mono-, di-, and poly-acrylates and methacrylates (e.g., methyl acrylate, methyl methacrylate, ethyl acrylate, isopropyl methacrylate, n-hexyl acrylate, stearyl acrylate, allyl acrylate, glycerol diacrylate, glycerol triacrylate, ethyleneglycol diacrylate, diethyleneglycol diacrylate, triethyleneglycol dimethacrylate,1,3-propanediol diacrylate, 1,3-propanediol dimethacrylate, trimethylolpropane triacrylate, 1,2, 4-butanetriol trimethacrylate, 1,4-cyclohexanediol diacrylate, pentaerythritol triacrylate, pentaerythritol tetraacrylate, pentaerythritol tetramethacrylate, sorbitol hexacrylate, bis[1-(2-acryloxy)]-p-ethoxyphenyldimethylmethane, bis[1-(3-acryloxy-2-hydroxy)]-p-propoxyphenyldimethylmethane, trishydroxyethyl-isocyanurate trimethacrylate, the bis-acrylates and bis-methacrylates of polyethylene glycols of molecular weight about 200–500, copolymerizable mixtures of acrylated monomers such as those of U.S. Pat. No. 4,652,274 (Boettcher et al.), and acrylated oligomers such as those of U.S. Pat. No. 4,642,126 (Zador, et al.)); unsaturated amides (e.g., methylene bis-acrylamide, methylene bis-methacrylamide, 1,6-hexamethylene bis-acrylamide, diethylene triamine tris-acrylamide and beta-methacrylaminoethyl methacrylate); vinyl compounds (e.g., styrene, diallyl phthalate, divinyl succinate, divinyl adipate, and divinyl phthalate); and the like; and mixtures thereof. Suitable reactive polymers include polymers with pendant (meth)acrylate groups, for example, having from 1 to about 50 (meth)acrylate groups per polymer chain. Examples of such polymers include aromatic acid (meth)acrylate half ester resins such as those resins available from Sartomer Company, Exton, Pa., under the trade designation "SARBOX" (e.g., "SARBOX 400", "SARBOX 401", "SARBOX 402", "SARBOX 404", and "SARBOX 405"). Other useful reactive polymers curable by free radical chemistry include those polymers that have a hydrocarbyl backbone and pendant peptide groups with free-radically polymerizable functionality attached thereto, such as those described in, for example, U.S. Pat. No. 5,235,015 (Ali et al.). Mixtures of two or more monomers, oligomers, and/or reactive polymers can be used if desired.

Suitable cationically-reactive species are described, for example, by Oxman et al. in U.S. Pat. Nos. 5,998,495 and 6,025,406 and include epoxy resins. Such materials, broadly called epoxides, include monomeric epoxy compounds and epoxides of the polymeric type and can be aliphatic, alicyclic, aromatic, or heterocyclic. These materials generally have, on the average, at least 1 polymerizable epoxy group per molecule (e.g., at least about 1.5 or even at least about 2). The polymeric epoxides include linear polymers having terminal epoxy groups (e.g., a diglycidyl ether of a polyoxyalkylene glycol), polymers having skeletal oxirane units (e.g., polybutadiene polyepoxide), and polymers having pendant epoxy groups (e.g., a glycidyl methacrylate polymer or copolymer). The epoxides can be pure compounds or can be mixtures of compounds containing one, two, or more epoxy groups per molecule. These epoxy-containing materials can vary greatly in the nature of their backbone and substituent groups. For example, the backbone can be of any type and substituent groups thereon can be any group that does not substantially interfere with cationic cure at room temperature. The molecular weight of the epoxy-containing materials can vary from about 58 to about 100,000 or more.

Useful epoxy-containing materials include those which contain cyclohexene oxide groups such as epoxycyclohexanecarboxylates, typified by 3,4-epoxycyclohexylmethyl-3,4-epoxycyclohexanecarboxylate, 3,4-epoxy-2-methylcyclohexylmethyl-3,4-epoxy-2-methylcyclohexane carboxylate, and bis(3,4-epoxy-6-methylcyclohexylmethyl) adipate. A more detailed list of useful epoxides of this nature is set forth in U.S. Pat. No. 3,117,099 (Proops et al.).

Other epoxy-containing materials that are useful include glycidyl ether monomers of the formula

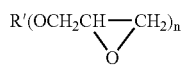

where R' is alkyl or aryl and n is an integer of 1 to 8, or even more. Examples are glycidyl ethers of polyhydric phenols obtained by reacting a polyhydric phenol with an excess of a chlorohydrin such as epichlorohydrin (e.g., the diglycidyl ether of 2,2-bis-(2,3-epoxypropoxyphenol)-propane). Additional examples of epoxides of this type are described in, for example, U.S. Pat. No. 3,018,262 (Schroeder), and in *Handbook of Epoxy Resins*, Lee and Neville, McGraw-Hill Book Company, New York (1967).

Commercially available epoxy resins can also be utilized. In particular, epoxides that are readily available include octadecylene oxide, epichlorohydrin, styrene oxide, vinylcyclohexene oxide, glycidol, glycidyl methacrylate, diglycidyl ethers of Bisphenol A (e.g., as available under the trade designations "EPON 828", "EPON 825", "EPON 1004", and "EPON 1010" from Resolution Performance Products, Houston, Tex., as well those available under the trade designations "DER-331", "DER-332", and "DER-334" from Dow Chemical Company, Midland, Mich. and as available under the trade designation "SU-8" from Micro-Chem Corporation, Newton, Mass., vinylcyclohexene dioxide (e.g., as available under the trade designation "ERL-4206" from Dow Chemical Company), 3,4-epoxycyclohexylmethyl-3,4-epoxycyclohexene carboxylate (e.g., as available under the trade designations "ERL-4221", "CYRACURE UVR 6110" or "UVR 6105" from Dow Chemical Company), 3,4-epoxy-6-methylcyclohexylmethyl-3,4-epoxy-6-methyl-cyclohexene carboxylate (e.g., as available under the trade designation "ERL-4201" from Dow Chemical Company), bis(3,4-epoxy-6-methylcyclohexylmethyl) adipate (e.g., as supplied under the trade designation "ERL-4289" from Dow Chemical Company), bis(2,3-epoxycyclopentyl) ether (e.g., as available under the trade designation "ERL-0400" from Dow Chemical Company), aliphatic epoxy modified from polypropylene glycol (e.g., as available under the trade designations "ERL-4050" or "ERL-4052" from Dow Chemical Company), dipentene dioxide (e.g., as supplied under the trade designation "ERL-4269" from Dow Chemical Company), epoxidized polybutadiene (e.g., as available under the trade designation "OXIRON 2001" from FMC Corporation, Philadelphia, Pa.), silicone resin containing epoxy functionality, flame retardant epoxy resins (e.g., a brominated bisphenol type epoxy resin available from Dow Chemical Company under the trade designation "DER-580"), 1,4-butanediol diglycidyl ether of phenolformaldehyde novolak (e.g., as available under the trade designations "DEN-431" or "DEN-438" from Dow Chemical Company), resorcinol diglycidyl ether (e.g., as available under the trade designation "KOPOXITE" from Koppers Company, Pittsburgh, Pa.), bis(3,4-epoxycyclohexyl)adipate (e.g., as available under the trade designations "ERL-4299" or "UVR-6128" from Dow Chemical Company), 2-(3,4-epoxycyclohexyl-5,5-spiro-3,4-epoxy) cyclohexane-meta-dioxane (e.g., as available under the trade designation "ERL-4234" from Dow Chemical Company), vinylcyclohexene monoxide 1,2-epoxyhexadecane (e.g., as available under the trade designation "UVR-6216" from Dow Chemical Company), alkyl glycidyl ethers such as alkyl $C_8$–$C_{10}$ glycidyl ether (e.g., as available under the trade designation "HELOXY MODIFIER 7" from Resolution Performance Products), alkyl C12–C14 glycidyl ether (e.g., as available under the trade designation "HELOXY MODIFIER 8" from Resolution Performance Products), butyl glycidyl ether (e.g., as available under the trade designation "HELOXY MODIFIER 61" from Resolution Performance Products), cresyl glycidyl ether (e.g., as available under the trade designation "HELOXY MODIFIER 62" from Resolution Performance Products), p-tert-butylphenyl glycidyl ether (e.g., as available under the trade designation "HELOXY MODIFIER 65" from Resolution Performance Products), polyfunctional glycidyl ethers such as diglycidyl ether of 1,4-butanediol (e.g., as available under the trade designation "HELOXY MODIFIER 67" from Resolution Performance Products), diglycidyl ether of neopentyl glycol (e.g., as available under the trade designation "HELOXY MODIFIER 68" from Resolution Performance Products), diglycidyl ether of cyclohexanedimethanol (e.g., as available under the trade designation "HELOXY MODIFIER 107" from Resolution Performance Products), trimethylolethane triglycidyl ether (e.g., as available under the trade designation "HELOXY MODIFIER 44" from Resolution Performance Products), trimethylolpropane triglycidyl ether (e.g., as available under the trade designation "HELOXY MODIFIER 48" from Resolution Performance Products), polyglycidyl ether of an aliphatic polyol (e.g., as available under the trade designation "HELOXY MODIFIER 84" from Resolution Performance Products), polyglycol diepoxide (e.g., as available under the trade designation "HELOXY MODIFIER 32" from Resolution Performance Products), bisphenol F epoxides (e.g., as available under the trade designation "EPON-1138" from Resolution Performance Products or "GY-281" from Ciba-Geigy Corporation, Ardsley, N.Y.), and 9,9-bis[4-(2,3-epoxypropoxy)-phenyl] fluorenone (as available under the trade designation "EPON 1079" from Resolution Performance Products).

Useful epoxy resins include epoxy-functional polymers such as, for example, copolymers of acrylic acid esters of glycidol (such as glycidyl acrylate and glycidyl methacrylate) with one or more copolymerizable vinyl compounds. Examples of such copolymers are 1:1 styrene-glycidyl methacrylate, 1:1 methyl methacrylate-glycidyl acrylate, and a 62.5:24:13.5 methyl methacrylate-ethyl acrylate-glycidyl methacrylate. Useful epoxy-functional polymers also include epoxy-functional silicones such as those described in U.S. Pat. No. 4,279,717 (Eckberg) and U.S. Pat. No. 5,753,346 (Kessel)).

Other useful epoxy resins include such epoxides as epichlorohydrins, alkylene oxides (e.g., propylene oxide), styrene oxide, alkenyl oxides (e.g., butadiene oxide), and glycidyl esters (e.g., ethyl glycidate).

Blends of various epoxy-containing materials can also be utilized. Such blends can comprise two or more weight average molecular weight distributions of epoxy-containing compounds (such as low molecular weight (below 200), intermediate molecular weight (about 200 to 10,000), and higher molecular weight (above about 10,000)). Alternatively or additionally, the epoxy resin can contain a blend of epoxy-containing materials having different chemical natures (such as aliphatic and aromatic) or functionalities (such as polar and non-polar). Other cationically-reactive polymers (such as vinyl ethers and the like) can additionally be incorporated, if desired.

Suitable cationally-reactive species also include vinyl ether monomers, oligomers, and reactive polymers (e.g., methyl vinyl ether, ethyl vinyl ether, tert-butyl vinyl ether, isobutyl vinyl ether, triethyleneglycol divinyl ether (e.g., as available under the trade designation "RAPI-CURE DVE-3" from International Specialty Products, Wayne, N.J.), trimethylolpropane trivinyl ether (e.g., as available under the trade designation "TMPTVE" from BASF Corporation, Mount Olive, N.J.), and divinyl ether resins (e.g., as available under the trade designations "VECTOMER 2010", "VECTOMER 2020", "VECTOMER 4010", or "VECTOMER 4020" from Morflex, Greensboro, N.C.), and their equivalents available from other manufacturers, and mixtures thereof. Blends (in any proportion) of one or more vinyl ether resins and/or one or more epoxy resins can also be utilized. Polyhydroxy-functional materials such as, for example, those described in U.S. Pat. No. 5,856,373 (Kaisaki et al.) can also be utilized in combination with epoxy- and/or vinyl ether-functional materials.

Non-curable species include, for example, reactive polymers whose solubility can be increased upon acid- or radical-induced reaction. Such reactive polymers include, for example, aqueous insoluble polymers bearing ester groups that can be converted by photogenerated acid to aqueous soluble acid groups (e.g., poly(4-tert-butoxycarbonyloxystyrene). Non-curable species also include the chemically-amplified photoresists described by R. D. Allen, G. M. Wallraff, W. D. Hinsberg, and L. L. Simpson in "High Performance Acrylic Polymers for Chemically Amplified Photoresist Applications," J. Vac. Sci. Technol. B, 9, 3357 (1991). The chemically-amplified photoresist concept is now widely used for microchip manufacturing, especially with sub-0.5 micron (or even sub-0.2 micron) features. In such photoresist systems, catalytic species (typically hydrogen ions) can be generated by irradiation, which induces a cascade of chemical reactions. This cascade occurs if hydrogen ions initiate reactions that generate more hydrogen ions or other acidic species, thereby amplifying reaction rate. Examples of typical acid-catalyzed chemically-amplified photoresist systems include deprotection (e.g., t-butoxycarbonyloxystyrene resists as described in U.S. Pat. No. 4,491,628 (Ito et al.), tetrahydropyran (THP) methacrylate-based materials, THP-phenolic materials such as those described in U.S. Pat. No. 3,779,778 (Smith et al.), t-butyl methacrylate-based materials such as those described by R. D. Allen et al. in Proc. SPIE 2438, 474 (1995), and the like); depolymerization (e.g., polyphthalaldehyde-based materials); and rearrangement (e.g., materials based on the pinacol rearrangements).

Other materials such as binders, plasticizers, stabilizers, surfactants, antistatic agents, coating aids, lubricants, fillers, and the like can also be present in the photoreactive composition. Many reactive species are commercially supplied with inhibitor(s) present to prevent premature reaction of the reactive species. In such cases, the inhibitor may be removed, although in practice of the present invention this is typically not necessary.

If desired, mixtures of different types of reactive species can be utilized in the photoreactive compositions. For example, mixtures of free-radically-reactive species and cationically-reactive species, mixtures of curable species and non-curable species, and so forth, are also useful.

In order to absorb light in a multiphoton process, the multiphoton initiator includes a multiphoton absorber (such as, e.g., a photosensitizer). In one embodiment, the multiphoton photoinitiator system includes a multiphoton absorber, an optional electron acceptor, and an optional electron donor.

Useful multiphoton absorbers have a two-photon absorption cross-section greater than or equal to the maximum two-photon absorption cross-section of fluorescein (i.e., greater than that of 3',6'-dihydroxyspiro[isobenzofuran-1 (3H), 9'-[9H]xanthen]3-one). At commonly used wavelengths, this typically translates to a two-photon cross-section of greater than about $50 \times 10^{-50}$ $cm^4$ sec/photon as can be determined, for example, according to the method described by C. Xu and W. W. Webb in J. Opt. Soc. Am. B, 13, 481 (1996) and WO 98/21521. Preferably, the two-photon absorption cross-section of the multiphoton absorber, at one or more wavelengths of the light used in practice of the present invention, is greater than or equal to the maximum two-photon absorption cross-section of fluorescein.

This method involves the comparison (under identical excitation intensity and multiphoton absorber concentration conditions) of the two-photon fluorescence intensity of the multiphoton absorber with that of a reference compound. The reference compound can be selected to match as closely as possible the spectral range covered by the multiphoton absorber absorption and fluorescence. In one possible experimental set-up, an excitation beam can be split into two arms, with 50% of the excitation intensity going to the multiphoton absorber and 50% to the reference compound. The relative fluorescence intensity of the multiphoton absorber with respect to the reference compound can then be measured using two photomultiplier tubes or other calibrated detector. Finally, the fluorescence quantum efficiency of both compounds can be measured under one-photon excitation.

Methods of determining fluorescence and phosphorescence quantum yields are well known in the art. Typically, the area under the fluorescence (or phosphorescence) spectrum of a compound of interest is compared with the area under the fluorescence (or phosphorescence) spectrum of a standard luminescent compound having a known fluorescence (or phosphorescence) quantum yield, and appropriate corrections are made (which take into account, for example, the optical density of the composition at the excitation wavelength, the geometry of the fluorescence detection apparatus, the differences in the emission wavelengths, and the response of the detector to different wavelengths). Standard methods are described, for example, by I. B. Berlman in *Handbook of Fluorescence Spectra of Aromatic Molecules*, Second Edition, pages 24–27, Academic Press, New York (1971); by J. N. Demas and G. A. Crosby in J. Phys. Chem. 75, 991–1024 (1971); and by J. V. Morris, M. A. Mahoney, and J. R. Huber in J. Phys. Chem. 80, 969–974 (1976).

Assuming that the emitting state is the same under one- and two-photon excitation (a common assumption), the two-photon absorption cross-section of the multiphoton absorber, ($\delta_{sam}$), is equal to $\delta_{ref} K (I_{sam}/I_{ref})(\Phi_{sam}/\Phi_{ref})$, wherein $\delta_{ref}$ is the two-photon absorption cross-section of the reference compound, $I_{sam}$ is the fluorescence intensity of the multiphoton absorber, $I_{ref}$ is the fluorescence intensity of the reference compound, $\Phi_{sam}$ is the fluorescence quantum efficiency of the multiphoton absorber, $\Phi_{ref}$ is the fluorescence quantum efficiency of the reference compound, and K is a correction factor to account for slight differences in the optical path and response of the two detectors. K can be determined by measuring the response with the same multiphoton absorber in both the sample and reference arms. To ensure a valid measurement, the clear quadratic dependence of the two-photon fluorescence intensity on excitation power can be confirmed, and relatively low concentrations of both the multiphoton absorber and the reference compound can be utilized (to avoid fluorescence re-absorption and multiphoton absorber aggregration effects).

If the multiphoton absorber is not fluorescent, the yield of electronic excited states can be measured and compared with a known standard. In addition to the above-described method of determining fluorescence yield, various methods of measuring excited state yield are known (including, for example, transient absorbance, phosphorescence yield, photoproduct formation or disappearance of multiphoton absorber (from photoreaction), and the like).

Preferably, the two-photon absorption cross-section of the multiphoton absorber is greater than about 1.5 times that of fluorescein (or, alternatively, greater than about $75 \times 10^{-50}$ cm$^4$ sec/photon, as measured by the above method); more preferably, greater than about twice that of fluorescein (or, alternatively, greater than about $100 \times 10^{-50}$ cm$^4$ sec/photon); more preferably, greater than about three times that of fluorescein (or, alternatively, greater than about $150 \times 10^{-50}$ cm$^4$ second/photon); and more preferably, greater than about four times that of fluorescein (or, alternatively, greater than about $200 \times 10^{-50}$ cm$^4$ sec/photon).

A multiphoton absorber may be selected based in part upon shelf stability considerations. Accordingly, selection of a particular multiphoton absorber can depend to some extent upon the particular reactive species utilized (as well as upon the choices of electron donor compound and/or electron acceptor). Useful multiphoton absorbers include, for example, those exhibiting large multi-photon absorption cross-sections, such as Rhodamine B (that is, N-[9-(2-carboxyphenyl)-6-(diethylamino)-3H-xanthen-3-ylidene]-N-ethylethanaminium chloride and the hexafluoroantimonate salt of Rhodamine B) and the four classes of multiphoton absorbers described, for example, by Marder and Perry et al. as described in WO 98/21521 and WO 99/53242. The four classes can be described as follows: (a) molecules in which two donors are connected to a conjugated π-electron bridge; (b) molecules in which two donors are connected to a conjugated π-electron bridge which is substituted with one or more electron accepting groups; (c) molecules in which two acceptors are connected to a conjugated π-electron bridge; and (d) molecules in which two acceptors are connected to a conjugated π-electron bridge which is substituted with one or more electron donating groups (where "bridge" means a molecular fragment that connects two or more chemical groups, "donor" means an atom or group of atoms with a low ionization potential that can be bonded to a conjugated π-electron bridge, and "cceptor" means an atom or group of atoms with a high electron affinity that can be bonded to a conjugated π-electron bridge).

Representative examples of such multiphoton absorbers include the following:

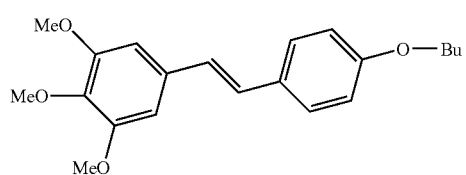

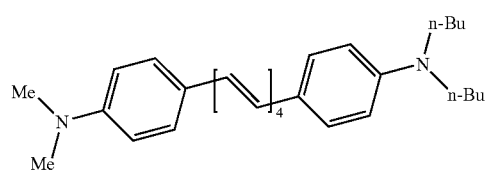

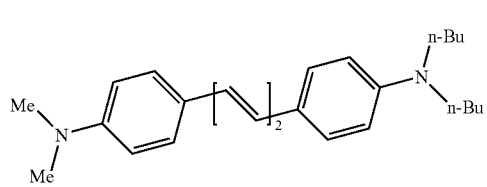

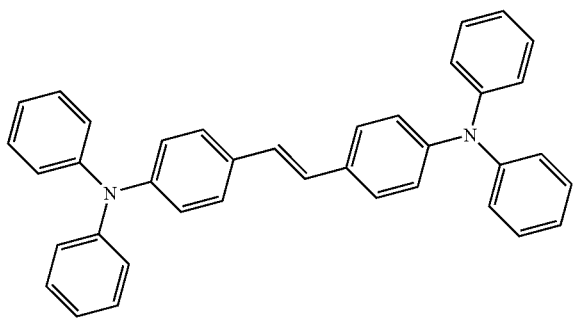

-continued
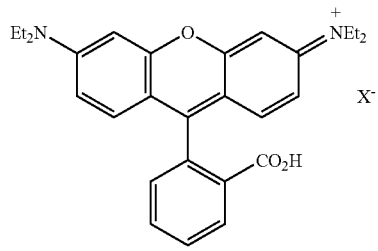
where X⁻ = Cl⁻, PF$_6^-$, SbF$_6^-$, AsF$_6^-$, BF$_4^-$, CF$_3$SO$_3^-$
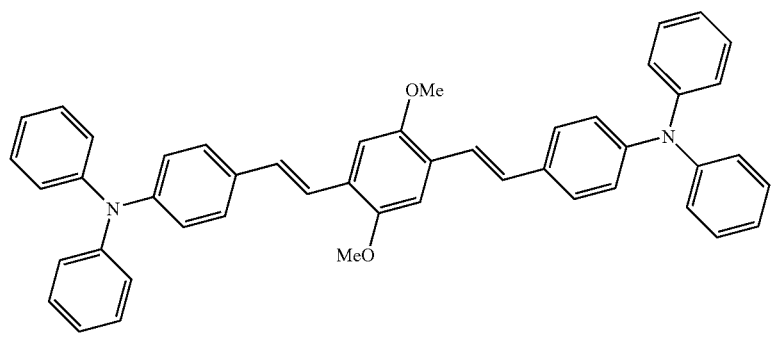
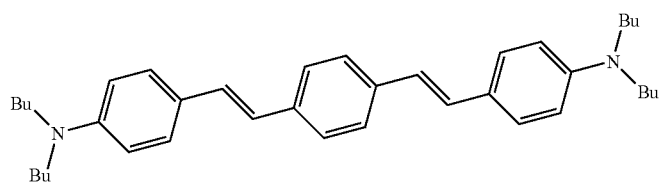
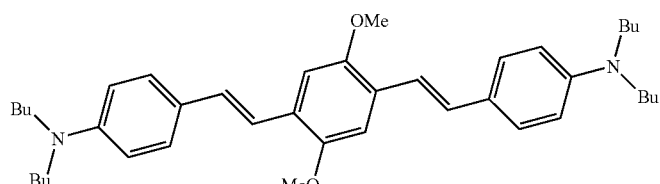
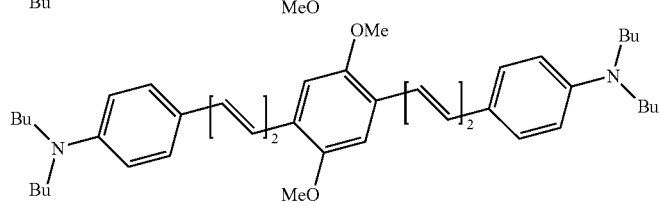
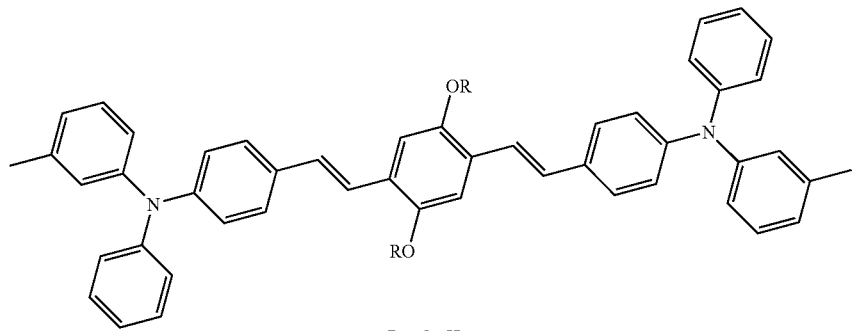
R = C$_{12}$H$_{25}$ -continued
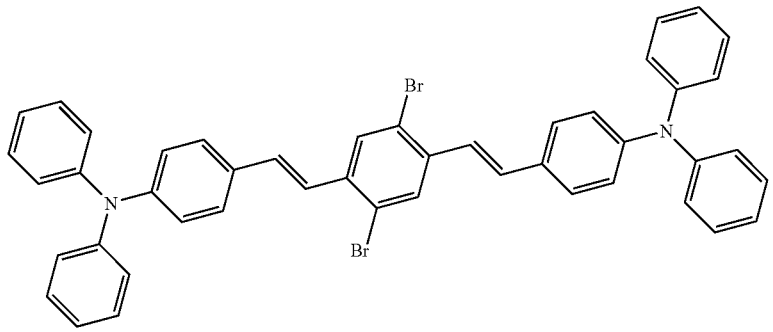
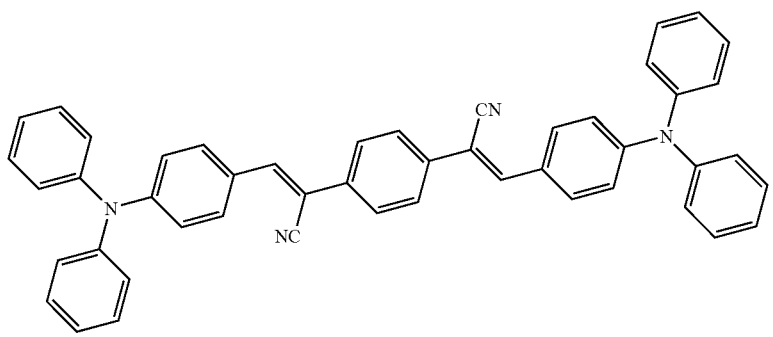
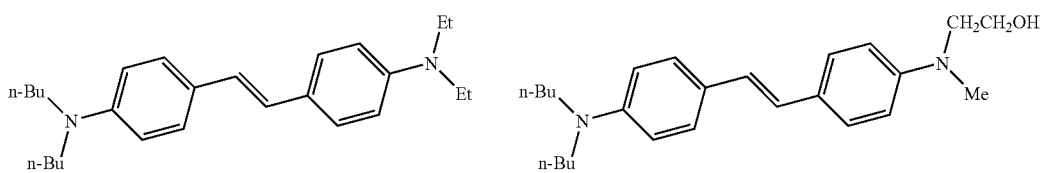
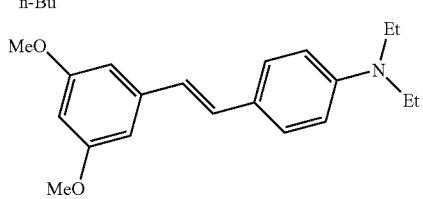
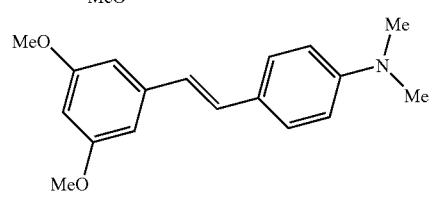
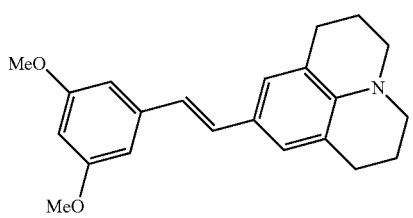
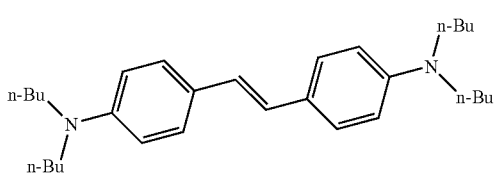
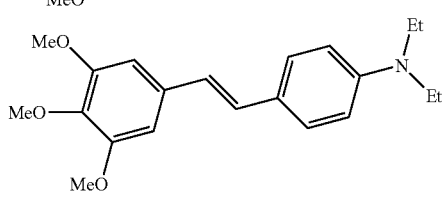
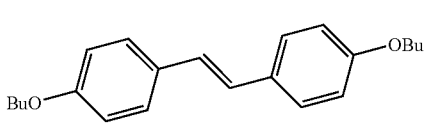

-continued
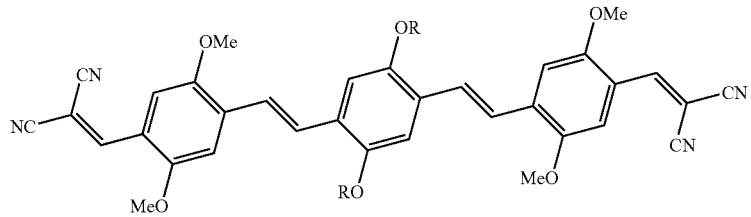
R = C₁₂H₂₅
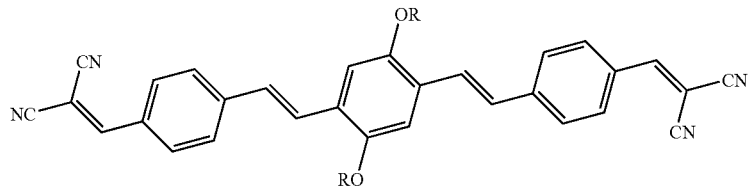
R = C₁₂H₂₅
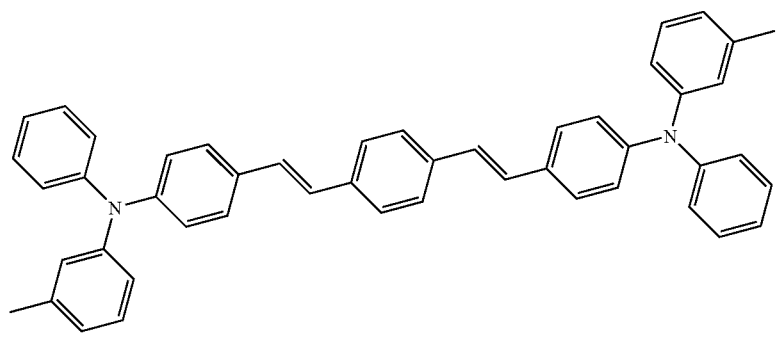
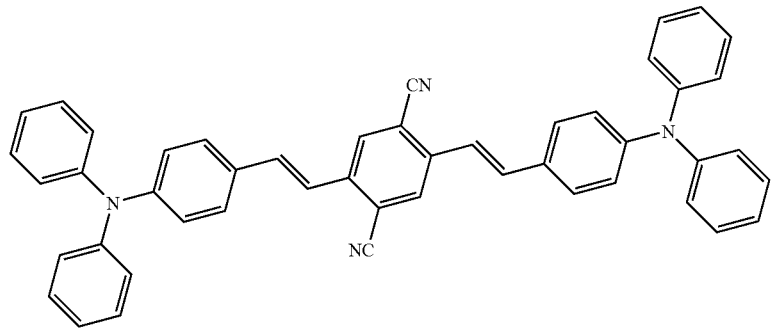
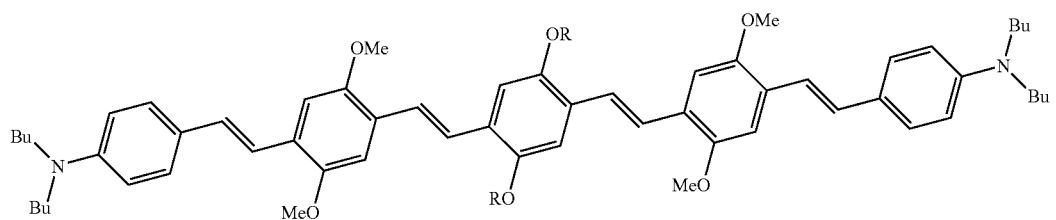
R = C₁₂H₂₅
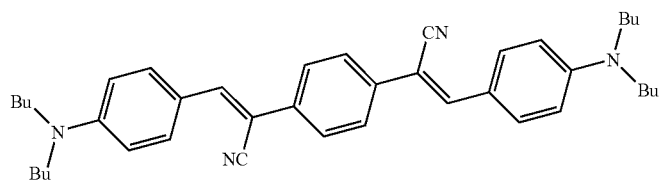

-continued

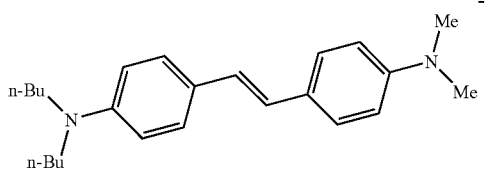

The four classes of multiphoton absorbers described above can be prepared, for example, by reacting aldehydes with ylides under standard Wittig conditions or by using the McMurray reaction, as detailed in WO 98/21521.

Other suitable compounds are described in U.S. Pat. No. 6,100,405 (Reinhardt et al.), U.S. Pat. No. 5,859,251 (Reinhardt et al.), and U.S. Pat. No. 5,770,737 (Reinhardt et al.), as having large multi-photon absorption cross-sections, although these cross-sections were determined by a method other than that described above. Such compounds include molecules in which an electron donating group and an electron accepting group are connected to a conjugated π-electron bridge. Representative examples of such compounds include the following:

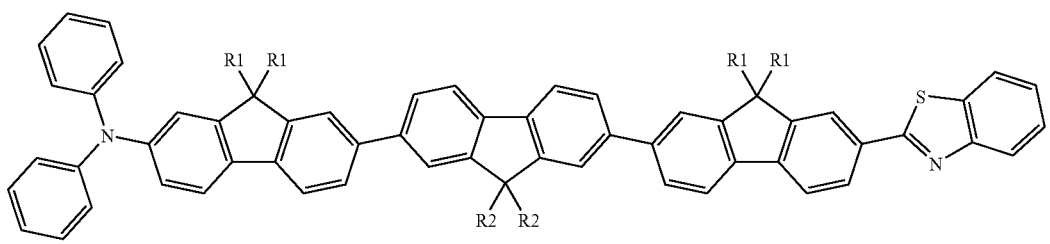

R1 = $C_2H_5$
R2 = $C_{10}H_{21}$

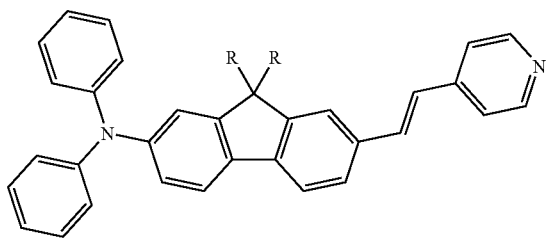

R = $C_{10}H_{21}$

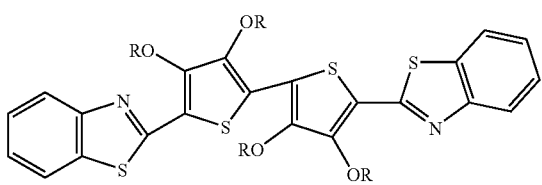

R = $C_{10}H_{21}$

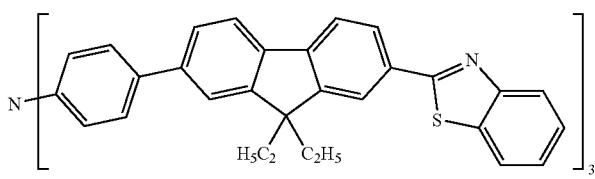

-continued
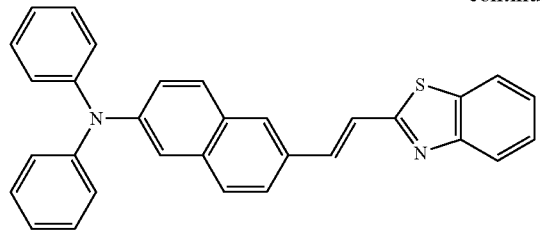
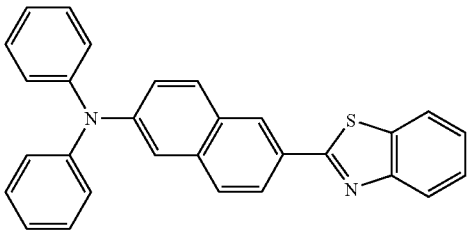
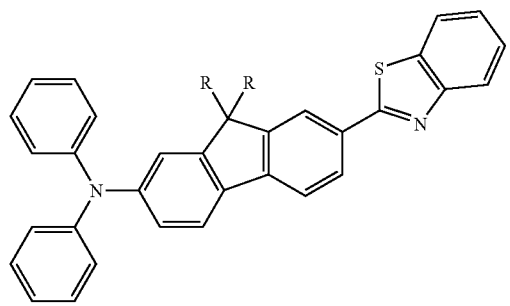
R = R = C2H5, C10H21, C18H37
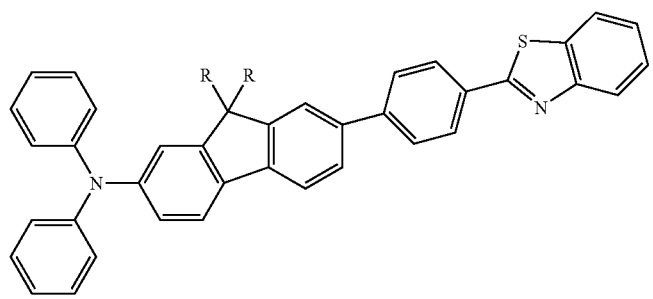
R = C$_2$H$_5$
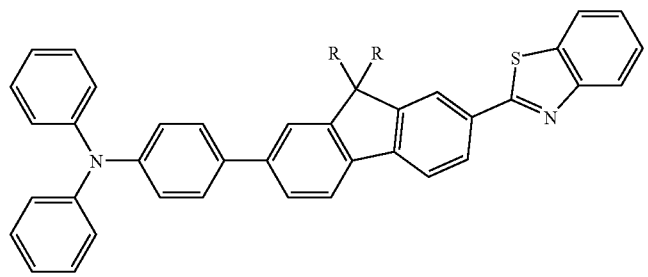
R = C$_2$H$_5$
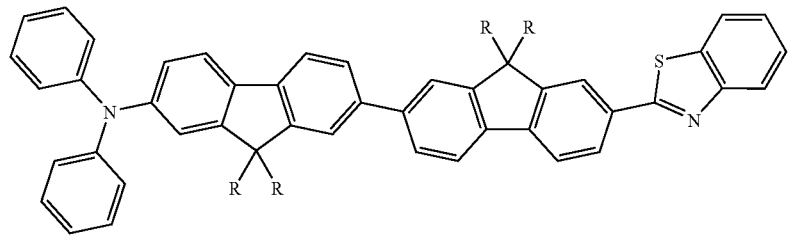
R = C$_2$H$_5$ Suitable optional electron acceptors for the photoreactive compositions are capable of being photosensitized by accepting an electron from an electronic excited state of the multiphoton absorber, resulting in the formation of at least one free radical and/or acid. Such electron acceptors include iodonium salts (for example, diaryliodonium salts), chloromethylated triazines (for example, 2-methyl-4,6-bis(trichloromethyl)-s-triazine, 2,4,6-tris(trichloromethyl)-s-triazine, and 2-aryl-4,6-bis(trichloromethyl)-s-triazine), diazonium salts (for example, phenyldiazonium salts optionally substituted with groups such as alkyl, alkoxy, halo, or nitro), sulfonium salts (for example, triarylsulfonium salts optionally substituted with alkyl or alkoxy groups, and optionally having 2,2' oxy groups bridging adjacent aryl moieties), azinium salts (for example, an N-alkoxypyridinium salt), and triarylimidazolyl dimers (preferably, 2,4,5-triphenylimidazolyl dimers such as 2,2',4,4',5,5'-tetraphenyl-1,1'-biimidazole, optionally substituted with groups such as alkyl, alkoxy, or halo), and the like, and mixtures thereof.

If the photoreactive composition includes one or more reactive specie that are cationically reactive, then the multiphoton photoinitiator system should typically include an electron acceptor capable of generating acid such as, for example, onium salts (e.g., iodonium, sulfonium, diazonium salts) such those described hereinbelow.

The electron acceptor is preferably soluble in the reactive species and is preferably shelf-stable (that is, does not spontaneously promote reaction of the reactive species if dissolved therein in the presence of the multiphoton absorber and an electron donor compound). Accordingly, selection of a particular electron acceptor can depend to some extent upon the particular reactive species, multiphoton absorber, and electron donor compound chosen, as described above.

Suitable iodonium salts include those described in U.S. Pat. No. 5,545,676 (Palazzotto et al.); U.S. Pat. No. 3,729,313 (Smith); U.S. Pat. No. 3,741,769 (Smith); U.S. Pat. No. 3,808,006 (Smith et al.); U.S. Pat. No. 4,250,053 (Smith); and U.S. Pat. No. 4,394,403 (Smith). The iodonium salt can be a simple salt (for example, containing an anion such as $Cl^-$, $Br^-$, $I^-$ or $C_4H_5SO_3^-$) or a metal complex salt (for example, containing $SbF_6^-$, $PF_6^-$, $BF_4^-$, tetrakis(perfluorophenyl)borate, $SbF_5OH^-$ or $AsF_6^-$). Mixtures of iodonium salts can be used if desired.

Examples of useful aromatic iodonium complex salt electron acceptors include diphenyliodonium tetrafluoroborate; di(4-methylphenyl)iodonium tetrafluoroborate; phenyl-4-methylphenyliodonium tetrafluoroborate; di(4-heptylphenyl)iodonium tetrafluoroborate; di(3-nitrophenyl)iodonium hexafluorophosphate; di(4-chlorophenyl)iodonium hexafluorophosphate; di(naphthyl)iodonium tetrafluoroborate; di(4-trifluoromethylphenyl)iodonium tetrafluoroborate; diphenyliodonium hexafluorophosphate; di(4-methylphenyl)iodonium hexafluorophosphate; diphenyliodonium hexafluoroarsenate; di(4-phenoxyphenyl)iodonium tetrafluoroborate; phenyl-2-thienyliodonium hexafluorophosphate; 3,5-dimethylpyrazolyl-4-phenyliodonium hexafluorophosphate; diphenyliodonium hexafluoroantimonate; 2,2'-diphenyliodonium tetrafluoroborate; di(2,4-dichlorophenyl) iodonium hexafluorophosphate; di(4-bromophenyl) iodonium hexafluorophosphate; di(4-methoxyphenyl) iodonium hexafluorophosphate; di(3-carboxyphenyl) iodonium hexafluorophosphate; di(3-methoxycarbonylphenyl)iodonium hexafluorophosphate; di(3-methoxysulfonylphenyl)iodonium hexafluorophosphate; di(4-acetamidophenyl)iodonium hexafluorophosphate; di(2-benzothienyl)iodonium hexafluorophosphate; and diphenyliodonium hexafluoroantimonate; and the like; and mixtures thereof. Aromatic iodonium complex salts can be prepared by metathesis of corresponding aromatic iodonium simple salts (such as, for example, diphenyliodonium bisulfate) in accordance with the teachings of Beringer et al., J. Am. Chem. Soc. 81, 342 (1959).

Preferred iodonium salts include diphenyliodonium salts (such as diphenyliodonium chloride, diphenyliodonium hexafluorophosphate, and diphenyliodonium tetrafluoroborate), diaryliodonium hexafluoroantimonate (for example, those available under the trade designation "SARCAT SR 1012" from Sartomer Company), and mixtures thereof.

Suitable anions, X-, for the sulfonium salts (and for any of the other types of electron acceptors) include a variety of anion types such as, for example, imide, methide, boron-centered, phosphorous-centered, antimony-centered, arsenic-centered, and aluminum-centered anions.

Illustrative, but not limiting, examples of suitable imide and methide anions include $(C_2F_5SO_2)_2N^-$, $(C_4F_9SO_2)_2N^-$, $(C_8F_{17}SO_2)_3C^-$, $(CF_3SO_2)_3C^-$, $(CF_3SO_2)_2N^-$, $(C_4F_9SO_2)_3C^-$, $(CF_3SO_2)_2(C_4F_9SO_2)C^-$, $(CF_3SO_2)(C_4F_9SO_2)N^-$, $((CF_3)_2NC_2F_4SO_2)_2N^-$, $(CF_3)_2NC_2F_4SO_2C^-(SO_2CF_3)_2$, $(3,5-bis(CF_3)C_6H_3)SO_2N^-SO_2CF_3$, $C_6H_5SO_2C^-(SO_2CF_3)_2$, $C_6H_5SO_2N^-SO_2CF_3$, and the like. Preferred anions of this type include those represented by the formula $(R_fSO_2)_3C^-$, wherein $R_f$ is a perfluoroalkyl radical having from 1 to about 4 carbon atoms.

Illustrative, but not limiting, examples of suitable boron-centered anions include $F_4B^-$, $(3,5-bis(CF_3)C_6H_3)_4B^-$, $(C_6F_5)_4B^-$, $(p-CF_3C_6H_4)_4B^-$, $(m-CF_3C_6H_4)_4B^-$, $(p-FC_6H_4)_4B^-$, $(C_6F_5)_3(CH_3)B^-$, $(C_6F_5)_3(n-C_4H_9)B^-$, $(p-CH_3C_6H_4)_3(C_6F_5)B^-$, $(C_6F_5)_3FB^-$, $(C_6H_5)_3(C_6F_5)B^-$, $(CH_3)_2(p-CF_3C_6H_4)_2B^-$, $(C_6F_5)_3(n-C_{18}H_{37}O)B^-$, and the like. Preferred boron-centered anions generally contain 3 or more halogen-substituted aromatic hydrocarbon radicals attached to boron, with fluorine being the more preferred halogen. Illustrative, but not limiting, examples of the preferred anions include $(3,5-bis(CF_3)C_6H_3)_4B^-$, $(C_6F_5)_4B^-$, $(C_6F_5)_3(n-C_4H_9)B^-$, $(C_6F_5)_3FB^-$, and $(C_6F_5)_3(CH_3)B^-$.

Suitable anions containing other metal or metalloid centers include, for example, $(3,5-bis(CF_3)C_6H_3)_4Al^-$, $(C_6F_5)_4Al^-$, $(C_6F_5)_2F_4P^-$, $(C_6F_5)F_5P^-$, $F_6P^-$, $(C_6F_5)F_5Sb^-$, $F_6Sb^-$, $(HO)F_5Sb^-$, and $F_6As^-$. Preferably, the anion, $X^-$, is selected from tetrafluoroborate, hexafluorophosphate, hexafluoroarsenate, hexafluoroantimonate, and hydroxypentafluoroantimonate (for example, for use with cationically-curable species such as epoxy resins).

Examples of suitable sulfonium salt electron acceptors include: triphenylsulfonium tetrafluoroborate, methyldiphenylsulfonium tetrafluoroborate, dimethylphenylsulfonium hexafluorophosphate, triphenylsulfonium hexafluorophosphate, triphenylsulfonium hexafluoroantimonate, diphenylnaphthylsulfonium hexafluoroarsenate, tritolylsulfonium hexafluorophosphate, anisyldiphenylsulfonium hexafluoroantimonate, 4-butoxyphenyldiphenylsulfonium tetrafluoroborate, 4-chlorophenyldiphenylsulfonium hexafluorophosphate, tri(4-phenoxyphenyl)sulfonium hexafluorophosphate, di(4-ethoxyphenyl)methylsulfonium hexafluoroarsenate, 4-acetonylphenyldiphenylsulfonium tetrafluoroborate, 4-thiomethoxyphenyldiphenylsulfonium hexafluorophosphate, di(methoxysulfonylphenyl)methylsulfonium hexafluoroantimonate, di(nitrophenyl)phenylsulfonium hexafluoroantimonate, di(carbomethoxyphenyl)methylsulfonium hexafluorophosphate, 4-acetamidophenyldiphenylsulfonium tetrafluoroborate, dimethylnaphthylsulfonium hexafluorophosphate, trifluoromethyldiphenylsulfonium tetrafluoroborate, p-(phenylthiophenyl)diphenylsulfonium hexafluoroantimonate, 10-methylphenoxanthenium hexafluorophosphate, 5-methylthianthrenium hexafluorophosphate, 10-phenyl-9, 9-dimethylthioxanthenium hexafluorophosphate, 10-phenyl-9-oxothioxanthenium tetrafluoroborate, 5-methyl-10-oxothianthrenium tetrafluoroborate, and 5-methyl-10,10-dioxothianthrenium hexafluorophosphate.

Preferred sulfonium salts include triaryl-substituted salts such as triarylsulfonium hexafluoroantimonate (for example, those available under the trade designation "SARCAT SR1010" from Sartomer Company), triarylsulfonium hexafluorophosphate (for example, those available under the trade designation "SARCAT SR 1011" from Sartomer Company), and triarylsulfonium hexafluorophosphate (for example, those available under the trade designation "SARCAT KI85" from Sartomer Company).

Useful azinium salts include those described in U.S. Pat. No. 4,859,572 (Farid et al.) that include an azinium moiety, such as a pyridinium, diazinium, or triazinium moiety. The azinium moiety can include one or more aromatic rings, typically carbocyclic aromatic rings (for example, quinolinium, isoquinolinium, benzodiazinium, and naphthodiazonium moieties), fused with an azinium ring. A quaternizing substituent of a nitrogen atom in the azinium ring can be released as a free radical upon electron transfer from the electronic excited state of the multiphoton absorber to the azinium electron acceptor. In one preferred form, the quaternizing substituent is an oxy substituent. The oxy substituent, —O-T, which quaternizes a ring nitrogen atom of the azinium moiety can be selected from among a variety of synthetically convenient oxy substituents. The moiety T can, for example, be an alkyl radical, such as methyl, ethyl, butyl, and so forth. The alkyl radical can be substituted. For example, aralkyl (for example, benzyl and phenethyl) and sulfoalkyl (for example, sulfomethyl) radicals can be useful. In another form, T can be an acyl radical, such as an —OC(O)-T$^1$ radical, where T$_1$ can be any of the various alkyl and aralkyl radicals described above. In addition, T$^1$ can be an aryl radical, such as phenyl or naphthyl. The aryl radical can in turn be substituted. For example, T$^1$ can be a tolyl or xylyl radical. T typically contains from 1 to about 18 carbon atoms, with alkyl moieties in each instance above preferably being lower alkyl moieties and aryl moieties in each instance preferably containing about 6 to about 10 carbon atoms. Highest activity levels have been realized if the oxy substituent, —O-T, contains 1 or 2 carbon atoms. The azinium nuclei need include no substituent other than the quaternizing substituent. However, the presence of other substituents is not detrimental to the activity of these electron acceptors.

Useful triarylimidazolyl dimers include those described in U.S. Pat. No. 4,963,471 (Trout et al.). These dimers include, for example, 2-(o-chlorophenyl)-4,5-bis(m-methoxyphenyl)-1,1'-biimidazole; 2,2'-bis(o-chlorophenyl)-4,4',5,5'-tetraphenyl-1,1'-biimidazole; and 2,5-bis(o-chlorophenyl)-4-[3,4-dimethoxyphenyl]-1,1'-biimidazole.

Preferred electron acceptors include photoacid generators, such as iodonium salts (more preferably, aryliodonium salts), chloromethylated triazines, sulfonium salts, and diazonium salts. More preferred are aryliodonium salts and chloromethylated triazines.

Useful optional electron donor compounds are compounds (other than the multiphoton absorber itself) that are capable of donating an electron to an electronic excited state of the multiphoton absorber. The electron donor compounds preferably have an oxidation potential that is greater than zero and less than or equal to that of p-dimethoxybenzene. Preferably, the oxidation potential is between about 0.3 and 1 volt vs. a standard saturated calomel electrode ("S.C.E.").

The electron donor compound is also preferably soluble in the reactive species and is selected based in part upon shelf stability considerations (as described above). Suitable donors are generally capable of increasing the speed of cure or the image density of a photoreactive composition upon exposure to light of the desired wavelength.

If working with cationically-reactive species, those skilled in the art will recognize that the electron donor compound, if of significant basicity, can adversely affect the cationic reaction as described, for example, in U.S. Pat. No. 6,025,406 (Oxman et al.).

In general, electron donor compounds suitable for use with particular multiphoton absorbers and electron acceptors can be selected by comparing the oxidation and reduction potentials of the three components (as described, for example, in U.S. Pat. No. 4,859,572 (Farid et al.)). Such potentials can be measured experimentally (for example, by the methods described by R. J. Cox, *Photographic Sensitivity*, Chapter 15, Academic Press (1973)) or can be obtained from references such as N. L. Weinburg, Ed., *Technique of Electroorganic Synthesis Part II: Techniques of Chemistry*, Vol. volt (1975), and C. K. Mann and K. K. Barnes, *Electrochemical Reactions in Nonaqueous Systems* (1970). The potentials reflect relative energy relationships and can be used in the manner described below to guide electron donor compound selection.

If the multiphoton absorber is in an electronic excited state, an electron in the highest occupied molecular orbital (HOMO) of the multiphoton absorber has been lifted to a higher energy level (namely, the lowest unoccupied molecular orbital (LUMO) of the multiphoton absorber), and a vacancy is left behind in the molecular orbital it initially occupied. The electron acceptor can accept the electron from the higher energy orbital, and the electron donor compound can donate an electron to fill the vacancy in the originally occupied orbital, provided certain relative energy relationships are satisfied.

If the reduction potential of the electron acceptor is less negative (or more positive) than that of the multiphoton absorber, an electron in the higher energy orbital of the multiphoton absorber is readily transferred from the multiphoton absorber to the lowest unoccupied molecular orbital (LUMO) of the electron acceptor, since this represents an exothermic process. Even if the process is instead slightly endothermic (that is, even if the reduction potential of the multiphoton absorber is up to 0.1 volt more negative than that of the electron acceptor) ambient thermal activation can readily overcome such a small barrier.

In an analogous manner, if the oxidation potential of the electron donor compound is less positive (or more negative) than that of the multiphoton absorber, an electron moving from the HOMO of the electron donor compound to the orbital vacancy in the multiphoton absorber is moving from a higher to a lower potential, which again represents an exothermic process. Even if the process is slightly endothermic (that is, even if the oxidation potential of the multiphoton absorber is up to 0.1 volt more positive than that of the electron donor compound), ambient thermal activation can readily overcome such a small barrier.

Slightly endothermic reactions in which the reduction potential of the multiphoton absorber is up to 0.1 volt more negative than that of the electron acceptor, or the oxidation potential of the multiphoton absorber is up to 0.1 volt more positive than that of the electron donor compound, occur in every instance, regardless of whether the electron acceptor or the electron donor compound first reacts with the multiphoton absorber in its excited state. If the electron acceptor or the electron donor compound is reacting with the multiphoton absorber in its excited state, it is preferred that the reaction be exothermic or only slightly endothermic. If the electron acceptor or the electron donor compound is reacting with the multiphoton absorber ion radical, exothermic reactions are still preferred, but still more endothermic reactions can be expected in many instances to occur. Thus, the reduction potential of the multiphoton absorber can be 0.2 volt or more, more negative than that of a second-to-react electron acceptor, or the oxidation potential of the multiphoton absorber can be 0.2 volt or more, more positive than that of a second-to-react electron donor compound.

Suitable electron donor compounds include, for example, those described by D. F. Eaton in *Advances in Photochemistry*, edited by B. Volman et al., Volume 13, pp. 427–488, John Wiley and Sons, New York (1986); U.S. Pat. No. 6,025,406 (Oxman et al.), and U.S. Pat. No. 5,545,676 (Palazzotto et al.). Such electron donor compounds include amines (including triethanolamine, hydrazine, 1,4-diazabicyclo[2.2.2]octane, triphenylamine (and its triphenylphosphine and triphenylarsine analogs), aminoaldehydes, and aminosilanes), amides (including phosphoramides), ethers (including thioethers), ureas (including thioureas), sulfinic acids and their salts, salts of ferrocyanide, ascorbic acid and its salts, dithiocarbamic acid and its salts, salts of xanthates, salts of ethylene diamine tetraacetic acid, salts of $(alkyl)_p$ $(aryl)_q$borates (p+q=4) (tetraalkylammonium salts preferred), various organometallic compounds such as $SnR_4$ compounds (where each R is independently chosen from among alkyl, aralkyl (particularly, benzyl), aryl, and alkaryl groups) (for example, such compounds as $n-C_3H_7Sn(CH_3)_3$, $(allyl)Sn(CH_3)_3$, and $(benzyl)Sn(n-C_3H_7)_3$), ferrocene, and the like, and mixtures thereof. The electron donor compound can be unsubstituted or can be substituted with one or more non-interfering substituents. Particularly preferred electron donor compounds contain an electron donor atom (such as a nitrogen, oxygen, phosphorus, or sulfur atom) and an abstractable hydrogen atom bonded to a carbon or silicon atom alpha to the electron donor atom.

Preferred amine electron donor compounds include alkyl-, aryl-, alkaryl- and aralkyl-amines (for example, methylamine, ethylamine, propylamine, butylamine, triethanolamine, amylamine, hexylamine, 2,4-dimethylaniline, 2,3-dimethylaniline, o-, m- and p-toluidine, benzylamine, aminopyridine, N,N'-dimethylethylenediamine, N,N'-diethylethylenediamine, N,N'-dibenzylethylenediamine, N,N'-diethyl-1,3-propanediamine, N,N'-diethyl-2-butene-1,4-diamine, N,N'-dimethyl-1,6-hexanediamine, piperazine, 4,4'-trimethylenedipiperidine, 4,4'-ethylenedipiperidine, p-N,N-dimethyl-aminophenethanol and p-N-dimethylaminobenzonitrile); aminoaldehydes (for example, p-N,N-dimethylaminobenzaldehyde, p-N,N-diethylaminobenzaldehyde, 9-julolidine carboxaldehyde, and 4-morpholinobenzaldehyde); and aminosilanes (for example, trimethylsilylmorpholine, trimethylsilylpiperidine, bis(dimethylamino)diphenylsilane, tris(dimethylamino)methylsilane, N,N-diethylaminotrimethylsilane, tris(dimethylamino)phenylsilane, tris(methylsilyl)amine, tris(dimethylsilyl)amine, bis(dimethylsilyl)amine, N,N-bis(dimethylsilyl)aniline, N-phenyl-N-dimethylsilylaniline, and N,N-dimethyl-N-dimethylsilylamine); and mixtures thereof. Tertiary aromatic alkylamines, particularly those having at least one electron-withdrawing group on the aromatic ring, have been found to provide especially good shelf stability. Good shelf stability has also been obtained using amines that are solids at room temperature. Good photographic speed has been obtained using amines that contain one or more julolidinyl moieties.

Preferred amide electron donor compounds include N,N-dimethylacetamide, N,N-diethylacetamide, N-methyl-N-phenylacetamide, hexamethylphosphoramide, hexaethylphosphoramide, hexapropylphosphoramide, trimorpholinophosphine oxide, tripiperidinophosphine oxide, and mixtures thereof.

Preferred alkylarylborate salts include:
$Ar_3B^-(n-C_4H_9)N^+(C_2H_5)_4$,
$Ar_3B^-(n-C_4H_9)N^+(CH_3)_4$,
$Ar_3B^-(n-C_4H_9)N^+(n-C_4H_9)_4$,
$Ar_3B^-(n-C_4H_9)Li^+$,
$Ar_3B^-(n-C_4H_9)N^+(C_6H_{13})_4$,
$Ar_3B^-(C_4H_9)N^+(CH_3)_3(CH_2)_2CO_2(CH_2)_2CH_3$,
$Ar_3B^-(C_4H_9)N^+(CH_3)_3(CH_2)_2OCO(CH_2)_2CH_3$,
$Ar_3B^-(sec-C_4H_9)N^+(CH_3)_3(CH_2)_2CO_2(CH_2)_2CH_3$,
$Ar_3B^-(sec-C_4H_9)N^+(C_6H_{13})_4$,
$Ar_3B^-(C_4H_9)N^+(C_8H_{17})_4$,
$Ar_3B^-(C_4H_9)N^+(CH_3)_4$,
$(p-CH_3O-C_6H_4)_3B^-(n-C_4H_9)N^+(n-C_4H_9)_4$,
$Ar_3B^-(C_4H_9)N^+(CH_3)_3(CH_2)_2OH$,
$ArB^-(n-C_4H_9)_3N^+(CH_3)_4$,
$ArB^-(C_2H_5)_3N^+(CH_3)_4$,
$Ar_2B^-(n-C_4H_9)_2N^+(CH_3)_4$,
$Ar_3B^-(C_4H_9)N^+(C_4H_9)_4$,
$Ar_4B^-N^+(C_4H_9)_4$,
$ArB^-(CH_3)_3N^+(CH_3)_4$,
$(n-C_4H_9)_4B^-N^+(CH_3)_4$, and
$Ar_3B^-(C_4H_9)P^+(C_4H_9)_4$ wherein Ar is phenyl, naphthyl, substituted (preferably, fluoro-substituted) phenyl, substituted naphthyl, and like groups having greater numbers of fused aromatic rings, as well as tetramethylammonium n-butyltriphenylborate and tetrabutylammonium n-hexyl-tris(3-fluorophenyl)borate (available under the trade designations "CGI 437" and "CGI 7460" from Ciba Specialty Chemicals Corporation (Tarrytown, N.Y.)), and mixtures thereof.

Suitable ether electron donor compounds include 4,4'-dimethoxybiphenyl, 1,2,4-trimethoxybenzene, 1,2,4,5-tetramethoxybenzene, and the like, and mixtures thereof. Suitable urea electron donor compounds include N,N'-dimethylurea, N,N-dimethylurea, N,N'-diphenylurea, tetramethylthiourea, tetraethylthiourea, tetra-n-butylthiourea, N,N-di-n-butylthiourea, N,N'-di-n-butylthiourea, N,N-diphenylthiourea, N,N'-diphenyl-N,N'-diethylthiourea, and the like, and mixtures thereof.

Preferred electron donor compounds for free radical-induced reactions include amines that contain one or more julolidinyl moieties, alkylarylborate salts, and salts of aromatic sulfinic acids. However, for such reactions, the electron donor compound can also be omitted, if desired (for example, to improve the shelf stability of the photoreactive composition or to modify resolution, contrast, and reciprocity). Preferred electron donor compounds for acid-induced reactions include 4-dimethylaminobenzoic acid, ethyl 4-dimethylaminobenzoate, 3-dimethylaminobenzoic acid, 4-dimethylaminobenzoin, 4-dimethylaminobenzaldehyde, 4-dimethylaminobenzonitrile, 4-dimethylaminophenethyl alcohol, and 1,2,4-trimethoxybenzene.

It is within the scope of this invention that an electron donor, electron acceptor, or both can be covalently tethered to a multiphoton sensitizer as described, for example, in WO 02/079691. Other multiphoton photoinitiator systems such as, for example, those described in WO 98/21521 may also be used.

The reactive species, multiphoton absorber, optional electron donor compounds, and optional electron acceptor compounds can be prepared by the methods described above, or by other methods known in the art. Many are commercially available. These components can be combined under "safe light" conditions using any order and manner of combination (optionally, with stirring or agitation), although it is sometimes desirable (from a shelf life and thermal stability standpoint) to add the multiphoton photoinitiator system last (and after any heating step that is optionally used to facilitate dissolution of other components). Solvent can be used during mixing of the components of the photoreactive composition, if desired, provided the solvent is chosen so as to not react appreciably with the components of the composition. Suitable solvents include, for example, acetone, dichloromethane, tetrahydrofuran, cyclopentanone, and acetonitrile. The reactive species itself can also sometimes serve as a solvent for the other components.

Typically, the photoreactive composition contains at least about 5 percent (preferably, at least about 10 percent; more preferably, at least about 20 percent) up to about 99.8 percent by weight of one or more reactive species, based on the total solids weight of the photoreactive composition (i.e., the total weight of components other than any optional solvent that may be present). Components of the multiphoton photoinitiator system including, for example, the multiphoton absorber, optional electron acceptor, and optional electron donor are present in photochemically effective amounts (as defined above). For example, the photoreactive composition may contain from about 0.01 percent (preferably, at least about 0.1 percent; more preferably, at least about 0.2 percent) up to about 10 percent (preferably, up to about 5 percent) by weight of one or more photosensitizers, and either or both of (i) from about 0.01 percent (preferably, at least about 0.1 percent; more preferably, at least about 0.2 percent) up to about 10 percent (preferably, up to about 5 percent) by weight of one or more electron donor compounds and (ii) from about 0.1 percent to about 10 percent by weight of one or more electron acceptor compounds (preferably, from about 0.1 percent to about 5 percent), based on the total solids weight of the photoreactive composition (i.e., the total weight of components other than any optional solvent that may be present).

A wide variety of adjuvants can be included in the photoreactive compositions, depending upon the desired end use. Suitable adjuvants include solvents, diluents, resins, binders, plasticizers, pigments, dyes, inorganic or organic reinforcing or extending fillers (at preferred amounts of about 10 percent to 90 percent by weight based on the total weight of the composition), thixotropic agents, indicators, inhibitors, stabilizers, ultraviolet absorbers, medicaments (e.g., leachable fluorides), and the like. However, to avoid effects such as, for example, light scattering and diffusion during reaction leading to inhomogeneities in the final article, it may be desirable that the photoreactive composition be essentially free of inorganic particles (including nanoparticles). The amounts and types of such adjuvants and their manner of addition to the compositions will be familiar to those skilled in the art.

It is within the scope of this invention to include nonreactive polymeric binders in the compositions in order, for example, to control viscosity and to provide film-forming properties. Such polymeric binders can generally be chosen to be compatible with the reactive species. For example, polymeric binders that are soluble in the same solvent that is used for the reactive species, and that are free of functional groups that can adversely affect the course of reaction of the reactive species, can be utilized. Binders can be of a molecular weight suitable to achieve desired film-forming properties and solution rheology (e.g., molecular weights between about 5,000 and 1,000,000 daltons; preferably between about 10,000 and 500,000 daltons; more preferably, between about 15,000 and 250,000 daltons). Suitable polymeric binders include, for example, polystyrene, poly(methyl methacrylate), poly(styrene)-co-(acrylonitrile), cellulose acetate butyrate, and the like.

Prior to exposing the photoreactive composition to light, the resulting photoreactive compositions can be coated on a substrate, if desired, by any of a variety of coating methods known to those skilled in the art (including, for example, knife coating and spin coating). The substrate can be chosen from a wide variety of films, sheets, and other surfaces, depending upon the particular application and the method of exposure to be utilized. Preferred substrates are generally sufficiently flat to enable the preparation of a layer of photoreactive composition having a uniform thickness. For applications where coating is less desirable, the photoreactive composition can alternatively be exposed in bulk form.

Objects and advantages of this invention are further illustrated by the following non-limiting examples, but the particular materials and amounts thereof recited in these examples, as well as other conditions and, details, should not be construed to unduly limit this invention.

EXAMPLES

Unless otherwise noted, all reagents used in the examples were obtained, or are available, from general chemical suppliers such as Aldrich Chemical Company, Milwaukee, Wis., or may be synthesized by known methods.

Tetrahydrofuran was obtained from Burdick Jackson, Muskegon, Mich.;

"Epoxy Resin 1" was obtained under the trade designation "EPON SU-8" from Resolution Performance Products, Houston, Tex.;

"Epoxy Resin 2" was obtained under the trade designation "SU-8 R 2150" from MicroChem Corporation, Newton, Mass.;

"Epoxy Resin 3" was obtained under the trade designation "SU-8 2050" from MicroChem Corporation, Newton, Mass.;

"Acrylate 1" refers to tris(2-hydroxyethyl)isocyanurate triacrylate, obtained under the trade designation "SR368" from Sartomer Company, Exton, Pa;

"Acrylate 2" refers to an alkoxylated trifunctional acrylate ester obtained under the trade designation "SR9008" from Sartomer Company;

"Iodonium Salt 1" refers to a diaryliodonium hexafluoroantimonate obtained under the trade designation "SARCAT SR1012" from Sartomer Company; and Dye 1 refers to a multiphoton sensitizing dye, bis-[4-(diphenylamino)styryl]-1-(2-ethylhexyloxy)-4-(methoxy) benzene, prepared according to the following procedure: A mixture of 2,5-bis(chloromethyl)-1-methoxy-4-(2-ethylhexyloxy)benzene (28.26 g), prepared according to the procedure of U.S. Pat. No. 5,189,136 (Wudl et al.) and triethyl phosphite (37.4 g) was heated to reflux for 6 hours. After cooling, the product was heated under high vacuum to remove residual triethyl phosphite. A thick oil was obtained which slowly crystallized after several days and was used without further purification in the following step. To a mixture of the thick oil (11.60 g), 4-diphenylaminobenzaldehyde (12.34 g), and dry tetrahydrofuran (400 mL) was added dropwise potassium t-butoxide (1.0 M in tetrahydrofuran, 44 mL). The mixture was stirred for 3 hours at room temperature, then the solvent was removed under vacuum. Water (100 mL) was added to the residue, and the mixture was extracted several times with methylene chloride. The combined organic layers were washed with brine, dried over anhydrous magnesium sulfate and the solvent was removed under vacuum. The crude product was purified by column chromatography on silica gel using 30/70 methylene chloride/hexane to give 14.44 g of bis-[4-(diphenylamino)stryl]-1-(2-ethylhexyloxy),4-(methoxy)benzene as a bright green solid.

General Substrate Priming Procedure

A substrate is cleaned by soaking it for 10 minutes in a 3:1 mixture of sulfuric acid (98 percent) and hydrogen peroxide (30 percent solution in $H_2O$), followed by thorough rinsing with deionized water, rinsing again with isopropanol, and then blowing it dry. The cleaned substrate is dip coated in a 2 percent by weight solution of the specified primer in slightly acidic (pH 4–5) aqueous ethanol (190 proof). The slide is rinsed briefly in anhydrous ethanol, cured for 10 minutes in a 130° C. oven, and then allowed to cool.

General Procedure for Determination of Voxel Dimensions

Electron microscopy is used to obtain images of the top and side views of each suspended bar. The voxel vertical dimension (i.e., in the direction of light propagation, VVD) and the voxel radial dimension (i.e., perpendicular to the direction of light propagation, VRD) were measured from electron micrographs at the center 20 percent of each suspended bar. VVD is determined using the side view. VRD is determined, using the top view, as the minimum distance between opposed resolved edges of the bar. The voxel aspect ratio equals the ratio VVD/VRD.

Examples 1–47

To a 62 percent by weight solution of Epoxy Resin 1 in propylene glycol methyl ether acetate (PGMEA) was added solutions of Dye 1 and Iodonium Salt 1, dissolved in a minimum volume of tetrahydrofuran, to give a photoresist solution having 0.5 percent by weight Dye 1 and 1 percent by weight lodonium Salt 1.

The resulting photoresist solution was spin coated onto silicon wafers primed with 2-(3,4-epoxycyclohexyl)ethyltrimethoxysilane according to the General Substrate Priming Procedure, except that the primed wafers were cured at room temperature overnight. The coated wafers were then dried overnight in an oven at 60° C., and were then further dried in the oven at 95° C. for ten minutes to provide a dry coating thickness of approximately 30–50 micrometers.

Two-photon induced polymerization was carried out using the output of a Ti:sapphire laser (obtained under the trade designation "MAI TAI" from Spectra-Physics). The laser beam (800 nanometers, approximately 80 femtoseconds pulse width, 80 megahertz repetition rate, average power approximately 1 watt) was passed through appropriate neutral density filters to reduce the power, and was focused into the coating using an oil immersion objective with numeric aperture equal to 1.25 obtained from Edmund Industrial Optics, Barrington, N.J.

Immersion oil with a refractive index of 1.515 (obtained under the trade designation "CARGILLE TYPE A," from Cargille Laboratories, Cedar Grove, N.J.), was dropped directly on top of the coated films and the objective lens was immersed in the oil. Samples were placed on an air bearing 3-axis stage system (obtained from Aerotech, Pittsburgh, Pa.) with computer control of stage velocity, x, y, and z locations and shutter. The photopolymer-substrate interface location was determined by monitoring 2-photon induced fluorescence as a function of z-axis location. The reported average power was measured at the output of the microscope objective using a wavelength calibrated Ophir photodiode (obtained from Ophir Optronics Ltd., Wilmington, Mass.). The resultant structures consisted of polymeric bars held between solid polymeric supports and suspended 15–20 micrometers above the substrate. The exposed samples were heated on a series of hot plates, first at 75° C. for 1 minute, then at 95° C. for 5 minutes, then at 75° C. for 1 minute, and were then developed in PGMEA with minimal agitation. Exposure conditions and corresponding voxel aspect ratios were determined according to the General Procedure for Determination of Voxel Dimensions (above), and are reported in Table 1 (below).

TABLE 1

| EXAMPLE | Laser Power, milliwatts | Scan speed, millimeters per minute | VVD, micrometers | VRD, micrometers | Aspect Ratio |
|---|---|---|---|---|---|
| 1 | 0.40 | 1.25 | 5.33 | 0.82 | 6.5 |
| 2 | 0.40 | 1.74 | 5.25 | 0.88 | 6.0 |
| 3 | 0.40 | 2.45 | 4.48 | 0.73 | 6.1 |
| 4 | 0.40 | 3.42 | 3.88 | 0.64 | 6.1 |
| 5 | 0.40 | 4.85 | 3.25 | 0.57 | 5.7 |
| 6 | 0.40 | 6.70 | 2.44 | 0.68 | 3.6 |
| 7 | 0.40 | 9.52 | 0.73 | 0.82 | 0.9 |
| 8 | 0.40 | 13.35 | 0.44 | 0.70 | 0.6 |
| 9 | 0.49 | 1.25 | 7.70 | 1.19 | 6.5 |
| 10 | 0.49 | 1.74 | 7.13 | 1.09 | 6.5 |
| 11 | 0.49 | 2.45 | 6.42 | 1.11 | 5.8 |
| 12 | 0.49 | 3.42 | 5.39 | 0.94 | 5.8 |
| 13 | 0.49 | 4.85 | 4.72 | 0.90 | 5.3 |
| 14 | 0.49 | 6.70 | 3.88 | 0.71 | 5.5 |
| 15 | 0.49 | 9.52 | 3.33 | 0.66 | 5.1 |
| 16 | 0.49 | 13.35 | 2.75 | 0.70 | 4.0 |
| 17 | 0.49 | 18.92 | 2.23 | 0.80 | 2.8 |
| 18 | 0.49 | 26.66 | 0.78 | 0.70 | 1.1 |
| 19 | 0.49 | 37.63 | 0.51 | 0.47 | 1.1 |
| 20 | 0.60 | 1.25 | 8.67 | 1.38 | 6.3 |
| 21 | 0.60 | 1.74 | 8.16 | 1.20 | 6.8 |
| 22 | 0.60 | 2.45 | 7.16 | 1.20 | 6.0 |
| 23 | 0.60 | 3.42 | 6.55 | 1.19 | 5.5 |
| 24 | 0.60 | 4.85 | 5.58 | 0.96 | 5.8 |
| 25 | 0.60 | 6.70 | 4.73 | 0.97 | 4.9 |
| 26 | 0.60 | 9.52 | 4.13 | 0.67 | 6.2 |
| 27 | 0.60 | 13.35 | 3.52 | 0.68 | 5.1 |
| 28 | 0.60 | 18.92 | 2.95 | 0.62 | 4.8 |
| 29 | 0.60 | 26.66 | 1.43 | 0.76 | 1.9 |
| 30 | 0.60 | 37.63 | 0.95 | 0.82 | 1.2 |
| 31 | 0.60 | 49.99 | 0.92 | 0.68 | 1.4 |
| 32 | 0.60 | 69.52 | 0.78 | 0.56 | 1.4 |
| 33 | 0.60 | 99.24 | 0.36 | 0.34 | 1.1 |
| 34 | 0.73 | 1.25 | 10.20 | 1.37 | 7.5 |
| 35 | 0.73 | 1.74 | 9.10 | 1.21 | 7.5 |
| 36 | 0.73 | 2.45 | 8.10 | 1.08 | 7.5 |
| 37 | 0.73 | 3.42 | 7.10 | 0.95 | 7.5 |
| 38 | 0.73 | 4.85 | 6.10 | 0.86 | 7.1 |
| 39 | 0.73 | 6.70 | 5.40 | 0.90 | 6.0 |
| 40 | 0.73 | 9.52 | 4.40 | 0.67 | 6.6 |
| 41 | 0.73 | 13.35 | 3.75 | 0.86 | 4.4 |
| 42 | 0.73 | 18.92 | 3.20 | 0.60 | 5.3 |
| 43 | 0.73 | 26.66 | 2.15 | 0.83 | 2.6 |
| 44 | 0.73 | 37.63 | 1.00 | 0.81 | 1.2 |
| 45 | 0.73 | 49.99 | 0.80 | 0.73 | 1.1 |
| 46 | 0.73 | 69.52 | 0.50 | 0.51 | 1.0 |
| 47 | 0.73 | 99.24 | 0.30 | 0.35 | 0.9 |

Examples 48–79

Poly(methyl methacrylate) having an average molecular weight 120,000 g/mole was combined with Acrylate 1 and Acrylate 2 in a 30:35:35 weight ratio, and the mixture was dissolved in sufficient 1,2-dichloroethane to give a solution that was 54 percent by weight dissolved components. This solution was combined with solutions of Dye 1 and Iodonium salt 1, dissolved in a minimum volume of tetrahydrofuran, to give a photoresist rising 0.5 percent by weight Dye 1 and 1 percent by weight Iodonium Salt 1.

The photoresist solution was spin coated onto glass microscope slides primed with 3-trimethoxysilyl)propyl methacrylate according to the General Substrate Priming procedure (above). The coated slides were then dried overnight in an oven at 60° C. to provide a day coating thickness of approximately 50 micrometers.

The dried coated films were exposed, developed, and analyzed generally according to the procedure used in Examples 1–47, except that the exposed samples were not heated before being developed. Exposure conditions and corresponding voxel aspect ratios were determined according to the General Procedure for Determination of Voxel Dimensions (above), are reported in Table 2 (below).

TABLE 2

| EXAMPLE | Laser Power, milliwatts | Scan speed, millimeters per minute | VVD, micrometers | VRD, micrometers | Aspect Ratio |
|---|---|---|---|---|---|
| 48 | 1.30 | 1.25 | 10.67 | 1.263 | 8.44 |
| 49 | 1.30 | 1.74 | 9.33 | 1.211 | 7.71 |
| 50 | 1.30 | 2.45 | 8.67 | 1.053 | 8.23 |
| 51 | 1.30 | 3.42 | 7.00 | 0.895 | 7.82 |
| 52 | 1.30 | 4.85 | 6.00 | 0.737 | 8.14 |
| 53 | 1.30 | 6.70 | 5.50 | 0.737 | 7.46 |
| 54 | 1.30 | 9.52 | 4.63 | 0.737 | 6.29 |
| 55 | 1.30 | 13.35 | 3.79 | 0.632 | 6.00 |
| 56 | 1.30 | 18.92 | 3.16 | 0.632 | 5.00 |
| 57 | 1.30 | 26.66 | 2.53 | 0.553 | 4.57 |
| 58 | 1.30 | 49.99 | 2.00 | 0.684 | 2.92 |
| 59 | 1.30 | 69.52 | 1.28 | 0.737 | 1.74 |
| 60 | 1.30 | 99.24 | 1.04 | 0.842 | 1.24 |
| 61 | 0.76 | 1.25 | 4.80 | 0.766 | 6.27 |
| 62 | 0.76 | 1.74 | 4.10 | 0.553 | 7.41 |
| 63 | 0.76 | 2.45 | 4.30 | 0.468 | 9.19 |
| 64 | 0.76 | 3.42 | 3.30 | 0.426 | 7.76 |
| 65 | 0.76 | 4.85 | 3.30 | 0.426 | 7.76 |
| 66 | 0.76 | 6.70 | 2.20 | 0.383 | 5.74 |
| 67 | 0.76 | 9.52 | 1.90 | 0.404 | 4.70 |
| 68 | 0.76 | 13.35 | 1.20 | 0.426 | 2.82 |
| 69 | 0.76 | 18.92 | 0.86 | 0.468 | 1.85 |
| 70 | 0.76 | 26.66 | 0.54 | 0.383 | 1.41 |
| 71 | 0.76 | 37.63 | 0.46 | 0.234 | 1.96 |
| 72 | 0.76 | 49.99 | 0.32 | 0.191 | 1.69 |
| 73 | 0.76 | 99.24 | 0.20 | 0.138 | 1.45 |
| 74 | 0.42 | 1.25 | 2.10 | 0.479 | 4.39 |
| 75 | 0.42 | 1.74 | 1.40 | 0.468 | 2.99 |
| 76 | 0.42 | 2.45 | 1.03 | 0.447 | 2.30 |
| 77 | 0.42 | 3.42 | 0.65 | 0.468 | 1.39 |
| 78 | 0.42 | 4.85 | 0.54 | 0.340 | 1.59 |
| 79 | 0.42 | 6.70 | 0.28 | 0.191 | 1.46 |

Examples 80–108

The procedure of Examples 48–79 was repeated except that the coated films were exposed using a 0.85 air objective. Exposure conditions and corresponding voxel aspect ratios were determined according to the General Procedure for Determination of Voxel Dimensions (above), and are reported in Table 3 (below). In Table 3, "NM" means not measured.

TABLE 3

| EXAMPLE | Laser Power, milliwatts | Scan speed, millimeters per minute | VVD, micrometers | VRD, micrometers | Aspect Ratio |
|---|---|---|---|---|---|
| 80 | 1.69 | 1.25 | 7.78 | 1.12 | 6.96 |
| 81 | 1.69 | 1.77 | 7.12 | 1.06 | 6.71 |
| 82 | 1.69 | 2.47 | 6.35 | 0.84 | 7.58 |
| 83 | 1.69 | 3.49 | NM | 1.01 | NM |
| 84 | 1.69 | 4.93 | 4.71 | 1.01 | 4.69 |
| 85 | 1.69 | 6.95 | 3.87 | 0.95 | 4.08 |
| 86 | 1.69 | 9.79 | 2.94 | 0.98 | 3.01 |
| 87 | 1.69 | 13.77 | 2.71 | 1.12 | 2.43 |
| 88 | 1.69 | 19.05 | 2.01 | 0.78 | 2.58 |
| 89 | 1.69 | 24.93 | 1.08 | 0.56 | 1.94 |
| 90 | 1.69 | 30.30 | 0.58 | 0.47 | 1.23 |
| 91 | 1.69 | 34.86 | 1.43 | 0.50 | 2.84 |
| 92 | 1.69 | 37.74 | 1.15 | 0.42 | 2.73 |
| 93 | 1.69 | 41.76 | 0.34 | 0.28 | 1.21 |
| 94 | 1.40 | 1.25 | 5.15 | 0.73 | 7.09 |
| 95 | 1.40 | 1.77 | 4.23 | 0.45 | 9.48 |
| 96 | 1.40 | 2.47 | 3.72 | 0.50 | 7.40 |
| 97 | 1.40 | 3.49 | 3.01 | 0.45 | 6.73 |
| 98 | 1.40 | 4.93 | 2.67 | 0.84 | 3.18 |
| 99 | 1.40 | 6.95 | 1.00 | 0.89 | 1.12 |
| 100 | 1.40 | 9.79 | 0.86 | 0.95 | 0.91 |
| 101 | 1.15 | 1.25 | 4.21 | 0.56 | 7.54 |
| 102 | 1.15 | 1.77 | 4.19 | 0.50 | 8.34 |
| 103 | 1.15 | 2.47 | 4.07 | 0.50 | 8.09 |
| 104 | 1.15 | 3.49 | 3.79 | 0.84 | 4.52 |
| 105 | 1.15 | 4.93 | 2.73 | 0.84 | 3.26 |
| 106 | 1.15 | 6.95 | 2.04 | 0.75 | 2.70 |
| 107 | 1.15 | 9.79 | 0.63 | 0.45 | 1.41 |
| 108 | 1.15 | 13.77 | 0.53 | 0.11 | 4.78 |

Examples 109–124

Dye 1 and Iodonium Salt 1 were dissolved in a minimum amount of PGMEA and this solution was added to Epoxy Resin 3 to give a final concentration of 0.1 percent by weight Dye 1 and 1 percent by weight Iodonium Salt 1. The resultant photoresist solution was filtered through a 2.7 micrometers pore size glass microfiber syringe filter (type GF/D, obtained from Whatman, Clifton, N.J.).

The photoresist solution was spin coated onto glass microscope slides primed with a primer obtained under the trade designation "OMNICOAT XP" from MicroChem Corporation, Newton, Mass., according to the directions provided by the manufacturer. The coated films were then heated on a hot plate at 65° C. for 1 minute, then at 95° C. for 15 minutes, and were then further heated in an oven at 110° C. for 20 minutes to provide a dry coating thickness of approximately 30–50 microns. Coated films were exposed using a 60× air objective lens with numeric aperture equal to 0.85 (obtained from Edmund Industrial Optics, Barrington, N.J.) and various laser powers and stage speeds, and were then heated and developed as described in Examples 1–47. The samples were analyzed by electron microscopy as described above. Exposure conditions and corresponding voxel aspect ratios were determined according to the General Procedure for Determination of Voxel Dimensions (above), and are reported in Table 4 (below).

TABLE 4

| EXAMPLE | Laser Power, milliwatts | Scan speed, millimeters per minute | VVD, micrometers | VRD, micrometers | Aspect Ratio |
|---|---|---|---|---|---|
| 109 | 1.73 | 1.25 | 18.50 | 1.70 | 10.90 |
| 110 | 1.73 | 1.77 | 8.40 | 1.80 | 4.70 |
| 111 | 1.73 | 2.50 | 2.70 | 1.90 | 1.40 |

TABLE 4-continued

| EXAMPLE | Laser Power, milliwatts | Scan speed, millimeters per minute | VVD, micrometers | VRD, micrometers | Aspect Ratio |
|---|---|---|---|---|---|
| 112 | 1.73 | 3.54 | 1.50 | 1.60 | 0.90 |
| 113 | 3.32 | 2.50 | 15.50 | 2.50 | 6.20 |
| 114 | 3.32 | 3.54 | 5.30 | 1.90 | 2.80 |
| 115 | 3.32 | 5.00 | 2.90 | 2.00 | 1.50 |
| 116 | 3.32 | 7.07 | 2.00 | 2.00 | 1.00 |
| 117 | 4.95 | 3.54 | 31.10 | 2.80 | 11.10 |
| 118 | 4.95 | 5.00 | 20.90 | 2.30 | 9.10 |
| 119 | 4.95 | 7.07 | 21.30 | 2.30 | 9.30 |
| 120 | 4.95 | 10.00 | 13.00 | 2.30 | 6.50 |
| 121 | 4.95 | 14.14 | 11.50 | 2.10 | 5.50 |
| 122 | 4.95 | 20.00 | 3.00 | 2.20 | 1.40 |
| 123 | 4.95 | 28.28 | 2.10 | 1.80 | 1.20 |
| 124 | 4.95 | 40.0 | 0.860 | 0.760 | 1.10 |

Examples 125–168

Four coating compositions were prepared as follows: Dye 1 and Iodonium Salt 1 wwere dissolved in a minimum amount of cyclopentanone, and were added to four samples of Epoxy Resin 2 in amounts necessary to give four coating compositions:

composition A contained 0.1 percent by weight Dye 1 and 0.25 percent by weight Salt 1;

Composition B contained 0.5 percent by weight Dye 1 and 0.25 percent by weight Iodonium Salt 1;

Composition C contained 0.1 percent by weight Dye 1 and 1 percent by weight Iodonium Salt 1; and Composition D contained 0.25 percent by weight Dye 1 and 0.5 percent by weight Iodonium Salt 1.

Compositions A–D were spin coated on glass microscope slides primed with 2-(3,4-epoxyclohexyl)-ethyltrimethoxysilane according to the General Substrate Priming Procedure (above). The coated slides were dried overnight in an oven at 60° C., and then in the oven at 95° C. for ten minutes resulting in dry coating thickness of approximately 30–50 micrometers. The dried coated films were exposed, developed, and analyzed generally according to the procedure used in Examples 1–47, except that except that the laser power was fixed at 1.25 milliwatts. Exposure conditions and corresponding voxel aspect ratios were determined according to the General Procedure for Determination of Voxel Dimensions (above), and are reported in Table 5 (below).

TABLE 5

| Example | Composition | Scan speed, millimeters per minute | VVD, micrometers | VRD, micrometers | Aspect Ratio |
|---|---|---|---|---|---|
| 125 | A | 1.00 | 6.01 | 1.13 | 5.30 |
| 126 | A | 1.41 | 5.30 | 1.16 | 4.60 |
| 127 | A | 2.00 | 4.10 | 1.14 | 3.60 |
| 128 | A | 2.83 | 2.73 | 1.19 | 2.30 |
| 129 | A | 4.00 | 1.52 | 1.25 | 1.20 |
| 130 | A | 5.66 | 1.21 | 1.19 | 1.00 |
| 131 | A | 8.00 | 0.86 | 0.91 | 0.90 |
| 132 | A | 11.31 | 0.71 | 0.71 | 1.00 |
| 133 | A | 16.00 | 0.46 | 0.42 | 1.10 |
| 134 | B | 1.25 | 9.25 | 1.01 | 9.20 |
| 135 | B | 1.77 | 9.38 | 0.98 | 9.60 |
| 136 | B | 2.50 | 8.45 | 0.97 | 8.70 |
| 137 | B | 3.54 | 7.81 | 0.91 | 8.60 |
| 138 | B | 5.00 | 6.27 | 0.87 | 7.20 |
| 139 | B | 7.07 | 5.14 | 0.98 | 5.20 |
| 140 | B | 10.00 | 4.08 | 0.93 | 4.40 |
| 141 | B | 14.14 | 3.43 | 1.08 | 3.20 |

TABLE 5-continued

| Example | Composition | Scan speed, millimeters per minute | VVD, micrometers | VRD, micrometers | Aspect Ratio |
|---|---|---|---|---|---|
| 142 | B | 20.00 | 1.43 | 1.23 | 1.20 |
| 143 | B | 28.28 | 0.90 | 0.93 | 1.00 |
| 144 | B | 40.00 | 0.55 | 0.52 | 1.10 |
| 145 | B | 56.57 | 0.24 | 0.26 | 0.90 |
| 146 | C | 1.25 | 10.83 | 1.46 | 7.40 |
| 147 | C | 1.77 | 9.78 | 1.39 | 7.10 |
| 148 | C | 2.50 | 8.93 | 1.32 | 6.80 |
| 149 | C | 3.54 | 7.82 | 1.25 | 6.30 |
| 150 | C | 5.00 | 6.14 | 1.15 | 5.30 |
| 151 | C | 7.07 | 4.96 | 1.07 | 4.60 |
| 152 | C | 10.00 | 3.67 | 1.33 | 2.80 |
| 153 | C | 14.14 | 2.75 | 1.26 | 2.20 |
| 154 | C | 20.00 | 1.34 | 1.09 | 1.20 |
| 155 | C | 28.28 | 0.80 | 0.75 | 1.10 |
| 156 | C | 40.00 | 0.44 | 0.41 | 1.10 |
| 157 | D | 1.25 | 11.68 | 1.42 | 8.20 |
| 158 | D | 1.77 | 10.38 | 1.33 | 7.80 |
| 159 | D | 2.50 | 9.70 | 1.34 | 7.20 |
| 160 | D | 3.54 | 8.21 | 1.19 | 6.90 |
| 161 | D | 5.00 | 7.55 | 1.21 | 6.20 |
| 162 | D | 7.07 | 5.79 | 1.34 | 4.30 |
| 163 | D | 10.00 | 5.15 | 1.42 | 3.60 |
| 164 | D | 14.14 | 3.78 | 1.62 | 2.30 |
| 165 | D | 20.00 | 2.60 | 1.53 | 1.70 |
| 166 | D | 28.28 | 1.62 | 1.36 | 1.20 |
| 167 | D | 40.00 | 1.39 | 0.91 | 1.50 |
| 168 | D | 56.57 | 0.42 | 0.43 | 1.00 |

Examples 169–182

Poly(styrene-co-acrylonitrile, 25 percent by weight acrylonitrile, molecular weight 165,000 g/mole was combined with Acrylate 1 and Acrylate 2 in a 30:35:35 weight ratio, and the mixture was dissolved in sufficient 1,2-dichloroethane to give a solution that was 56 percent by weight dissolved components. This solution was combined with solutions of Dye 1 and Iodonium Salt 1, dissolved in a minimum volume of cyclopentanone, to give a photoresist solution comprising 0.1 percent by weight Dye 1 and 1 percent by weight Iodonium Salt 1.

The photoresist solution was spin coated onto glass microscope slides primed with 3-(trimethoxysilyl)propyl methacrylate according to the General Substrate Priming Procedure (above). The coated slides were then dried overnight in an oven at 60° C. to provide a dry coating thickness of approximately 50 micrometers.

The dried coated films were exposed using an oil immersion objective with numeric aperture equal to 1.25 and a laser power of 1.72 milliwatts at various scan speeds, developed, and analyzed according to the procedure used in Examples 1–47. Exposure conditions and corresponding voxel aspect ratios were determined according to the General Procedure for Determination of Voxel Dimensions (above), and are reported in Table 6 (below).

TABLE 6

| EXAMPLE | Scan speed, millimeters per minute | VVD, micrometers | VRD, micrometers | Aspect Ratio |
|---|---|---|---|---|
| 169 | 1.25 | 0.85 | 0.71 | 1.20 |
| 170 | 1.77 | 0.81 | 0.57 | 1.42 |
| 171 | 2.50 | 0.78 | 0.70 | 1.13 |
| 172 | 3.56 | 0.66 | 0.59 | 1.12 |
| 173 | 5.02 | 0.57 | 0.55 | 1.05 |

TABLE 6-continued

| EXAMPLE | Scan speed, millimeters per minute | VVD, micrometers | VRD, micrometers | Aspect Ratio |
|---|---|---|---|---|
| 174 | 7.10 | 0.47 | 0.52 | 0.89 |
| 175 | 10.04 | 0.35 | 0.42 | 0.85 |
| 176 | 14.17 | 0.36 | 0.37 | 0.98 |
| 177 | 19.81 | 0.22 | 0.25 | 0.87 |
| 178 | 28.30 | 0.22 | 0.24 | 0.95 |
| 179 | 37.66 | 0.18 | 0.16 | 1.09 |
| 180 | 44.20 | 0.18 | 0.18 | 1.00 |
| 181 | 53.85 | 0.15 | 0.14 | 1.13 |
| 182 | 64.36 | 0.18 | 0.18 | 0.99 |

Various unforeseeable modifications and alterations of this invention may be made by those skilled in the art without departing from the scope and spirit of this invention, and it should be understood that this invention is not to be unduly limited to the illustrative embodiments set forth herein.

What is claimed is:

1. A process comprising:
a) providing a photoreactive composition, the photoreactive composition comprising at least one reactive specie and a photochemically-effective amount of a multiphoton photoinitiator system, wherein the multiphoton photoinitiator system comprises a multiphoton absorber having a two-photon absorption cross section greater than or equal to the maximum two-photon absorption cross-section of fluorescein;
b) exposing at least a portion of the photoreactive composition to light of appropriate wavelength and intensity such that simultaneous absorption of at least two photons by the photoreactive composition occurs, thereby causing at least partial reaction of at least one reactive specie and causing a portion of the photoreactive composition to become more, or less, soluble in at least one solvent than the photoreactive composition before exposure to the light, wherein the light passes through an optical system having a final optical element prior to reaching the photoreactive composition, and wherein the final optical element has a numeric aperture in a range of from 0.65 to 1.25, inclusive; and
c) developing the exposed photoreactive composition.

2. A process according to claim 1, wherein the photoreactive composition comprises a layer, and wherein the layer is supported on a substrate.

3. A process according to claim 1, wherein developing comprises solvent developing.

4. A process according to claim 1, wherein the process has a threshold dose, and wherein the actual dose is less than about 10 times the threshold dose.

5. A process according to claim 1, wherein the process has a threshold dose, and wherein the actual dose is less than about 4 times the threshold dose.

6. A process according to claim 1, wherein the process has a threshold dose, and wherein the actual dose is less than about 3 times the threshold dose.

7. A process according to claim 1, wherein the numeric aperture is less than or equal to 0.95.

8. A process according to claim 1, wherein the light is emitted from a source comprising a laser.

9. A process according to claim 8, wherein the light source emits at least one wavelength in a range of from 750 to 850 nanometers, inclusive.

10. A process according to claim 8, wherein the light source comprises a pulsed laser.

11. A process according to claim 10, wherein the laser has a pulse frequency of at least about 50 megahertz.

12. A process according to claim 8, wherein the light source comprises a continuous wave laser.

13. A process according to claim 8, wherein the laser has a Gaussian radial intensity beam profile.

14. A process according to claim 1, wherein the final optical element comprises at least one of a lens, microlens array, diffractive optical element, microscope objective, or mirror.

15. A process according to claim 1, wherein at least one reactive specie is curable.

16. A process according to claim 1, wherein at least one reactive specie is polymerizable.

17. A process according to claim 1, wherein the multiphoton absorber has a two-photon absorption cross-section greater than or equal to 1.5 times the maximum two-photon absorption cross-section of fluorescein.

18. A process according to claim 1, wherein the multiphoton absorber has a two-photon absorption cross-section greater than or equal to 2 times the maximum two-photon absorption cross-section of fluorescein.

19. A process according to claim 1, wherein the photoinitiator system comprises a multiphoton absorber, electron acceptor, and an electron donor.

20. A process according to claim 1, wherein the multiphoton absorber is selected from the group consisting of (a) Rhodamine B, (b) molecules in which two electron donating groups are connected to a conjugated pi-electron bridge, (c) molecules in which two electron donating groups are connected to a conjugated pi-electron bridge which is substituted with one or more electron accepting groups, (d) molecules in which two electron accepting groups are connected to a conjugated pi-electron bridge, (e) molecules in which two electron accepting groups are connected to a conjugated pi-electron bridge which is substituted with one or more electron donating groups, and (f) molecules in which an electron donating group and an electron accepting group are connected to a conjugated π-electron bridge.

21. A process according to claim 1, wherein the photoreactive composition further comprises at least one electron acceptor.

22. A process according to claim 21, wherein at least one electron acceptor is selected from the group consisting of iodonium salts, chloromethylated triazines, diazonium salts, sulfonium salts, azinium salts, triarylimidazolyl dimers, and combinations thereof.

23. A process according to claim 21, wherein the photoreactive composition further comprises at least one electron donor.

24. A process according to claim 23, wherein at least one electron donor is selected from the group consisting of amines; amides; ethers; ureas; sulfinic acids and their salts; salts of ferrocyanide, ascorbic acid and its salts; dithiocarbamic acid and its salts; salts of xanthates; salts of ethylene diamine tetraacetic acid; salts of $(alkyl)_p(aryl)_q$ borates, wherein p+q=4; $SnR_4$ compounds, wherein each R is independently selected from alkyl, aralkyl, aryl, and alkaryl groups; ferrocene; and combinations thereof.

25. A process according to claim 1, wherein at least one reactive specie is free-radically polymerizable.

26. A process according to claim 1, wherein at least one reactive specie is selected from the group consisting of acrylates, methacrylates, styrenes, and combinations thereof.

27. A process according to claim 1, wherein at least one reactive specie is cationically polymerizable.

28. A process according to claim 1, wherein at least one reactive specie is selected from the group consisting of epoxides, vinyl ethers, cyanate esters, and combinations thereof.

29. A process according to claim 1, wherein at least one reactive specie is an epoxide, and wherein the numeric aperture is less than or equal to 0.95.

30. A process according to claim 1, wherein the final optical element comprises an immersion objective.

31. A process according to claim 1, wherein the final optical element comprises an air objective.

32. A process according to claim 1, further comprising, after step b), heating the exposed photoreactive composition.

33. A process according to claim 1, wherein in step b) at least a portion of the photoreactive composition becomes more soluble in at least one solvent than the photoreactive composition before exposure to the light.

34. A process according to claim 1, wherein in step b) at least a portion of the photoreactive composition becomes less soluble in at least one solvent than the photoreactive composition before exposure to the light.

* * * * *

UNITED STATES PATENT AND TRADEMARK OFFICE
CERTIFICATE OF CORRECTION

PATENT NO. : 7,118,845 B2
APPLICATION NO. : 10/455675
DATED : October 10, 2006
INVENTOR(S) : Robert J. Devoe It is certified that error appears in the above-identified patent and that said Letters Patent is hereby corrected as shown below:

On the Title Page, Page 3, Item -56-
Under (Other Publications), line 7, delete "Efficienct" and insert -- Efficient --, therefor.

Col. 1
Line 18, delete "flied" and insert -- filed --, therefor.
Line 61, delete "muitiphoton" and insert -- multiphoton --, therefor.
Line 64, delete "inaterial," and insert -- material, --, therefor.

Col. 3
Line 18, delete "$10_{-14}$" and insert -- $10^{-14}$ --, therefor.

Col. 4
Line 12, delete "$(1\times 10_{-13}sec)$," and, insert -- $(1\times 10^{-13} sec)$, --, therefor.
Line 27, delete "Ray" and insert -- RAY --, therefor.
Line 37, delete "$10^9$" and insert -- $10^{-9}$ --, therefor.

Col. 12
Line 40, delete ""cceptor"" and insert -- "acceptor" --, therefor.

Col. 24
Line 36, delete "balogen" and insert -- halogen --, therefor.

Col. 25
Line 24, delete "quatemizing" and insert -- quaternizing --, therefor.
Lines 28-29, delete "quatemizing" and insert-- quaternizing --, therefor.
Line 38, delete "$T_1$" and insert -- $T^1$ --, therefor.

Col. 31
Line 45, delete "lodonium" and insert -- Iodonium --, therefor.

UNITED STATES PATENT AND TRADEMARK OFFICE
CERTIFICATE OF CORRECTION

PATENT NO. : 7,118,845 B2
APPLICATION NO. : 10/455675
DATED : October 10, 2006
INVENTOR(S) : Robert J. Devoe It is certified that error appears in the above-identified patent and that said Letters Patent is hereby corrected as shown below:

<u>Col. 33</u>
Line 10, delete "rising" and insert -- solution comprising --, therefor.
Line 13, delete "3-trimethoxysilyl)" and insert -- 3-(trimethoxysilyl) --, therefor.
Line 15, delete "procedure" and insert -- Procedure --, therefor.
Line 16, delete "day" and insert -- dry --, therefor.
Line 24, after "(above)", insert -- and -- .

Signed and Sealed this

Twenty-second Day of May, 2007

JON W. DUDAS
*Director of the United States Patent and Trademark Office*